US010564497B2

(12) United States Patent
Kawata

(10) Patent No.: US 10,564,497 B2
(45) Date of Patent: Feb. 18, 2020

(54) ELECTRO-OPTICAL DEVICE AND ELECTRONIC APPARATUS

(71) Applicant: SEIKO EPSON CORPORATION, Tokyo (JP)

(72) Inventor: Hidenori Kawata, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 16/229,464

(22) Filed: Dec. 21, 2018

(65) Prior Publication Data
US 2019/0196282 A1 Jun. 27, 2019

(30) Foreign Application Priority Data

Dec. 26, 2017 (JP) ................. 2017-248834

(51) Int. Cl.
G02F 1/1362 (2006.01)
H01G 4/005 (2006.01)
G09G 3/36 (2006.01)
H01L 49/02 (2006.01)

(52) U.S. Cl.
CPC ..... G02F 1/136213 (2013.01); G09G 3/3648 (2013.01); H01G 4/005 (2013.01); H01L 28/60 (2013.01)

(58) Field of Classification Search
None
See application file for complete search history.

(56) References Cited

U.S. PATENT DOCUMENTS

| 5,807,770 A | 9/1998 | Mineji |
| 6,661,476 B1 | 12/2003 | Abe et al. |
| 7,764,325 B2 * | 7/2010 | Koyama ........... G02F 1/136213 349/38 |
| 2007/0165148 A1 | 7/2007 | Koyama |

FOREIGN PATENT DOCUMENTS

| JP | H08-250739 A | 9/1996 |
| JP | 2001-066638 A | 3/2001 |
| JP | 2004-325627 A | 11/2004 |
| JP | 2005-084197 A | 3/2005 |
| JP | 2005-115104 A | 4/2005 |
| JP | 2007-187921 A | 7/2007 |
| JP | 2015-094880 A | 5/2015 |

OTHER PUBLICATIONS

Zaima, S. et al., "Formation of silicide at metal/silicon interface and low-resistivity contacts," Department of Crystalline Materials Science, School of Engineering, Nagoya University, pp. 1094-1103.

* cited by examiner

Primary Examiner — Herve-Louis Y Assouman
(74) Attorney, Agent, or Firm — Oliff PLC

(57) ABSTRACT

A liquid crystal device as an electro-optical device includes a base substrate as a substrate, a TFT as a transistor, and a holding capacitor, and the holding capacitor includes a first capacitance electrode disposed on the base substrate side and a second capacitance electrode disposed on the first capacitance electrode via a capacitance insulation film, and the first capacitance electrode includes a first electrode layer containing tungsten silicide, a second electrode layer containing silicide of a metal more stabilized through silicidation than tungsten, and a third electrode layer containing silicon stacked one on another.

7 Claims, 18 Drawing Sheets

ELECTRO-OPTICAL DEVICE AND ELECTRONIC APPARATUS

BACKGROUND

1. Technical Field

The disclosure relates to an electro-optical device and an electronic apparatus including the electro-optical device.

2. Related Art

As an electro-optical device, for example, an active drive type liquid crystal device including a transistor capable of switch-controlling a potential of a pixel electrode for each pixel is known. In such a liquid crystal device, a holding capacitor configured to hold the potential applied to the pixel electrode is provided for each pixel. In pixels having high definition to achieve high-quality image display, the area in which the holding capacitor can be provided in each pixel reduces and thus, it becomes difficult to ensure a holding capacitor having desired electric capacitance. When the electric capacitance of the holding capacitor reduces, the potential applied to the pixel electrode cannot be held for predetermined time, and a defect in display such as flickering is caused.

To address such a defect related to a holding capacitor, for example, in each of JP-A-2001-66638, JP-A-2005-115104, and JP-A-2007-187921, there is proposed a configuration in which a holding capacitor having been provided in an upper layer of a transistor on a substrate in the related art is provided in a lower layer of a transistor. In particular, in JP-A-2005-115104, there is described an example in which a concave portion is formed in a substrate, and a capacitance element is formed at least partially overlapping with a bottom surface and side surfaces of the concave portion, to ensure electric capacitance.

In each of JP-A-2001-66638, JP-A-2005-115104, and JP-A-2007-187921 described above, examples of a material constituting an electrode in the holding capacitor include metals such as tungsten, molybdenum, tantalum, chromium, titanium, and niobium, an alloy or silicide of these metals, or conductive polysilicon. In addition, an example of a capacitance insulation film in the holding capacitor includes a silicon oxide. An interlayer insulation film containing, for example, a silicon oxide is formed to cover the holding capacitor provided on the substrate, and a semiconductor layer constituting the transistor is formed on the interlayer insulation film.

However, when a high temperature treatment is performed to form the semiconductor layer, the electrode formed by using a metal, an alloy, or polysilicon described above and being in contact with the interlayer insulation film or the capacitance insulation film may be oxidized, and a light shielding property may reduce. Similarly, in a case where the electrode is formed by using silicide of a metal, when a high temperature treatment is performed, silicon is liberated from the silicide of the metal and film quality changes, and again, a light shielding property may reduce or physical strength may decrease. Accordingly, depending on disposition of an electro-optical device with respect to a light source, when the light is incident from the substrate side toward the transistor and a light shielding property of the holding capacitor is reduced, the light is incident on the transistor to cause a light leakage current, and there has been an issue of a potential of a pixel electrode that cannot be switch-controlled stably.

SUMMARY

The disclosure is made to address at least some of the above-described issues, and can be realized as the following modes or application examples.

Application Example

An electro-optical device according to an application example includes a substrate, a transistor and a holding capacitor provided for each pixel on the substrate, and in the electro-optical device, the holding capacitor includes a first capacitance electrode provided between the substrate and the transistor and disposed on the substrate side, and a second capacitance electrode disposed on the first capacitance electrode via a capacitance insulation film, and the first capacitance electrode includes a first electrode layer containing tungsten silicide, a second electrode layer containing silicide of a metal more stabilized through silicidation than tungsten, and a third electrode layer containing silicon stacked one on another.

According to the application example, since the second electrode layer constituting the first capacitance electrode contains silicide of a metal more stabilized through silicidation than tungsten, the second electrode layer is more thermally stabilized than the first electrode layer containing tungsten silicide. In addition, the third electrode layer containing silicon is stacked on the second electrode layer. Accordingly, even when a high temperature treatment at, for example, 600° C. or greater is performed in forming the transistor or the like, silicidation proceeds owing to the heat applied to the second electrode layer, and silicon becomes difficult to liberate. For this reason, a defect of a reduction of a light shielding property or physical strength due to a change in film quality of the second electrode layer caused by the high temperature treatment can be prevented. In other words, as compared to a case where the first capacitance electrode includes only the first electrode layer containing tungsten silicide, a reduction of a light shielding property of the first capacitance electrode can be suppressed even when a high temperature treatment is performed. Additionally, the third electrode layer contains silicon and thus, in forming the capacitance insulation film including a silicon oxide film or a silicon nitride film on the third electrode layer, the third electrode layer becomes less susceptible to influence of the metal element incorporated in the second electrode layer, and a high insulation property can be ensured in the capacitance insulation film. Namely, the electro-optical device capable of blocking incident light by the first capacitance electrode constituting the holding capacitor even when the light is incident from the substrate side toward the transistor, and including the holding capacitor having desired electric capacitance can be provided.

In the electro-optical device described in the application example, the second capacitance electrode preferably includes a fourth electrode layer containing tungsten silicide, a fifth electrode layer containing silicide of a metal more stabilized through silicidation than tungsten, and a sixth electrode layer containing tungsten silicide stacked one on another.

According to the above-described configuration, since the fifth electrode layer constituting the second capacitance electrode and interposed between the fourth electrode layer and the sixth electrode layer contains silicide of a metal more stabilized through silicidation than tungsten, the fifth electrode layer is more thermally stabilized than the fourth electrode layer and the sixth electrode layer each containing tungsten silicide. Accordingly, even when a high temperature treatment at, for example, 600° C. or greater is performed in forming the transistor or the like, and owing to the heat applied to the fourth electrode layer or the sixth electrode layer, silicon is liberated to change film quality, the fifth electrode layer is thermally stabilized and thus, a reduction of a light shielding property of the second capacitance electrode can be suppressed. That is, light incident from the substrate side toward the transistor can be blocked by the first capacitance electrode and also the second capacitance electrode of the holding capacitor. That is, the electro-optical device including the holding capacitor having a further excellent light shielding property with respect to the transistor can be provided.

In the electro-optical device described in the application example, the third electrode layer preferably covers surfaces of the first electrode layer and the second electrode layer stacked one on another.

According to the above-described configuration, the first electrode layer and the second electrode layer are in contact with the capacitance insulation film via the third electrode layer. Accordingly, in a case where the capacitance insulation film is, for example, a silicon oxide film, even when a high temperature treatment at, for example, 600° C. or greater is performed in forming the transistor or the like, the capacitance insulation film is not in direct contact with the first electrode layer and the second electrode layer and thus, a reduction of the light shielding property due to oxidation can be prevented.

The electro-optical device described in the application example may include a scanning line provided between the substrate and the holding capacitor and electrically coupled to the transistor.

According to the above-described configuration, for example, when the scanning line is constituted by using a conductive material having a light shielding property, light incident from the substrate side toward the transistor can be blocked by the scanning line and the holding capacitor. In addition, even when a high temperature treatment at, for example, 600° C. or greater is performed in forming the transistor or the like, and a light shielding property of the scanning line reduces, light incident from the substrate side toward the transistor can be blocked by the holding capacitor.

The electro-optical device described in the application example may include a scanning line provided between the holding capacitor and the transistor and electrically coupled to the transistor, and the scanning line may include a first wiring layer containing tungsten silicide, a second wiring layer containing silicide of a metal more stabilized through silicidation than tungsten, and a third wiring layer containing tungsten silicide stacked one on another.

According to the above-described configuration, the second wiring layer is more thermally stabilized than the first wiring layer and the third wiring layer and thus, even when a high temperature treatment at, for example, 600° C. or greater is performed in forming the transistor, a reduction of the light shielding property of the scanning line can be suppressed. That is, light incident from the substrate side toward the transistor can be blocked reliably by the holding capacitor and the scanning line.

In the electro-optical device described in the application example, the metal is preferably selected from titanium (Ti), hafnium (Hf), and zirconium (Zr).

According to the above-described configuration, as compared to tungsten (W), titanium (Ti), hafnium (Hf), and zirconium (Zr) can constitute the second electrode layer or the fifth electrode layer, or the second wiring layer silicidized and subsequently thermally stabilized.

Application Example

A method of manufacturing an electro-optical device according to an application example is a method of manufacturing an electro-optical device including a transistor and a holding capacitor for each pixel, the method including forming a first capacitance electrode on a substrate, forming a capacitance insulation film covering the first capacitance electrode, forming a second capacitance electrode to face the first capacitance electrode via the capacitance insulation film and forming the holding capacitor, and forming the transistor to overlap in a plan view with the holding capacitor via an interlayer insulation film, wherein the forming a first capacitance electrode includes forming a first electrode layer containing tungsten silicide, forming a second electrode layer stacked on the first electrode layer and containing a metal more stabilized through silicidation than tungsten, forming a third electrode layer stacked on the second electrode layer and containing silicon, and after the forming the third electrode layer, performing a heat treatment at 600° C. or greater in an atmosphere containing an inert gas to silicidize the second electrode layer.

According to the application example, a heat treatment at 600° C. or greater in an atmosphere containing an inert gas is performed and thus, silicon liberated from the first electrode layer containing tungsten silicide and the third electrode layer containing silicon bonds to a metal incorporated in the second electrode layer to undergo silicidation. Thus, the second electrode layer silicidized is more thermally stabilized than the first electrode layer. Accordingly, even when a high-temperature treatment is performed in the step of subsequently forming the transistor or the like, silicidation proceeds owing to the heat applied to the second electrode layer, and silicon becomes difficult to liberate, and as compared to a case where the first capacitance electrode includes only the first electrode layer, a reduction of a light shielding property of the first capacitance electrode can be suppressed. In addition, the third electrode layer contains silicon and thus, in forming the capacitance insulation film including, for example, a silicon oxide film or a silicon nitride film on the third electrode layer, the third electrode layer becomes less susceptible to influence of the metal element incorporated in the second electrode layer, and a high insulation property can be ensured in the capacitance insulation film. A film forming apparatus used in forming the capacitance insulation film also becomes less susceptible to contamination by the above-described metal element. Namely, the method of manufacturing an electro-optical device capable of blocking incident light by the first capacitance electrode constituting the holding capacitor even when the light is incident from the substrate side toward the transistor, and including the holding capacitor having desired electric capacitance can be provided.

In the method of manufacturing an electro-optical device described in the application example, the forming a capacitance insulation film preferably includes subjecting a reaction gas to a heat treatment at 600° C. or greater by a low-pressure CVD method to form the capacitance insulation film.

According to the above-described method, the capacitance insulation film being a thin film but having an excellent coverage property can be formed. In addition, since heat at 600° C. or greater is applied to the first capacitance electrode in forming the capacitance insulation film by a low-pressure CVD method, silicon liberated from the first electrode layer or the third electrode layer can bond to the metal incorporated in the second electrode layer to undergo silicidation. Accordingly, a change in film quality of the second electrode layer due to the heat used in forming the capacitance insulation film becomes difficult to occur, and a reduction of the light shielding property of the first capacitance electrode is suppressed. That is, the forming a capacitance insulation film by a low-pressure CVD method includes performing a heat treatment at 600° C. or greater, and a separate heat treatment at 600° C. or greater is unnecessary for silicidizing the metal incorporated in the second electrode layer. Thus, manufacturing steps can be simplified.

In the method of manufacturing the electro-optical device according to the application example, the forming a second capacitance electrode preferably includes forming a fourth electrode layer containing tungsten silicide, forming a fifth electrode layer stacked on the fourth electrode layer and containing a metal more stabilized through silicidation than tungsten, and forming a sixth electrode layer stacked on the fifth electrode layer and containing tungsten silicide.

According to the above-described method, the fifth electrode layer constituting the second capacitance electrode and interposed between the fourth electrode layer and the sixth electrode layer is formed to include a metal more stabilized through silicidation than tungsten and thus, when a high-temperature treatment at, for example, 600° C. or greater is performed in the step of subsequently forming the transistor or the like, silicon liberated from the tungsten silicide owing to the heat applied to the fourth electrode layer or the sixth electrode layer reacts with the metal of the fifth electrode layer to form silicide. Accordingly, the fifth electrode layer silicidized is more thermally stabilized than the fourth electrode layer and the sixth electrode layer, and a reduction of a light shielding property of the second capacitance electrode due to heat can be suppressed. That is, light incident from the substrate side toward the transistor can be blocked by the first capacitance electrode and also the second capacitance electrode of the holding capacitor. That is, an electro-optical device including the holding capacitor having a further excellent light shielding property with respect to the transistor can be manufactured.

In the method of manufacturing an electro-optical device according to the application example described above, the metal is preferably selected from titanium (Ti), hafnium (Hf), and zirconium (Zr).

According to the above-described configuration, since titanium (Ti), hafnium (Hf), and zirconium (Zr) undergo silicidation and subsequently become more thermally stabilized than tungsten (W), titanium (Ti), hafnium (Hf), and zirconium (Zr) can form the second electrode layer or the fifth electrode layer thermally stabilized.

In the method of manufacturing an electro-optical device described in the application example, preferably, the first capacitance electrode and the capacitance insulation film are independently formed for each pixel, and the forming a fourth electrode layer includes forming the fourth electrode layer to cover the capacitance insulation film.

According to the above-described method, the capacitance insulation film is independently formed for each pixel on the substrate and is not formed as a so-called solid film and thus, even when a high temperature treatment at, for example, 600° C. or greater is performed in the step of forming the transistor or the like, the fourth electrode layer is formed to cover the capacitance insulation film and thus, oxidation of the fifth electrode layer due to the capacitance insulation film and a reduction of a light shielding property can be prevented.

In the method of manufacturing an electro-optical device described in the application example, preferably, the first capacitance electrode is formed independently for each pixel, the method includes forming a contact hole configured to couple the first capacitance electrode to the transistor, and the forming a contact hole includes forming a through hole penetrating the fifth electrode layer and the fourth electrode layer of the second capacitance electrode, and during the forming a sixth electrode layer of the second capacitance electrode, forming the sixth electrode layer to cover an inner side of the through hole, and etching and removing the sixth electrode layer in the through hole to expose the third electrode layer of the first capacitance electrode in the through hole.

According to the above-described method, at an inner wall of the contact hole configured to couple the first capacitance electrode to the transistor, the fifth electrode layer is covered with the sixth electrode layer without being exposed. That is, since the fifth electrode layer is not exposed in the contact hole, a defect of oxidation of an exposed portion due to a heat treatment and a reduction of a light shielding property can be prevented.

In the method of manufacturing an electro-optical device described in the application example, the forming a second capacitance electrode preferably includes forming the second capacitance electrode to surround an opening region of a pixel to form a capacitance line to which a fixed potential is applied in common with a plurality of pixels.

According to the above-described method, as compared to the case where the first capacitance electrode is formed as a capacitance line, the second capacitance electrode defining the opening region of the pixel is formed on the side closer to the transistor on the substrate and thus, the second capacitance electrode having an excellent light shielding property with respect to the transistor and functioning as a capacitance line can be formed.

Application Example

An electronic apparatus according to an application example includes the electro-optical device described in the application example.

According to the application example, the electronic apparatus capable of blocking light incident from the substrate side toward the transistor by the holding capacitor and thus, capable of suppressing occurrence of a light leakage current in the transistor to realize a stabilized driving state can be provided.

BRIEF DESCRIPTION OF THE DRAWINGS

The invention will be described with reference to the accompanying drawings, wherein like numbers reference like elements.

DESCRIPTION OF EXEMPLARY EMBODIMENTS

Exemplary embodiments of the disclosure will be described below with reference to the accompanying drawings. Note that in each of the figures below, to illustrate each of layers and each of members in a recognizable size, each of the layers and each of the members are illustrated in a scale different from an actual scale.

In an exemplary embodiment, an active drive type liquid crystal device including a Thin Film Transistor (hereinafter referred to as a TFT) for each pixel will be described as an example of an electro-optical device. The liquid crystal device can be used favorably as light modulation means (liquid crystal light bulb) of, for example, a projection-type display apparatus (liquid crystal projector) described below.

First Exemplary Embodiment

Electro-Optical Device

Figure 1:
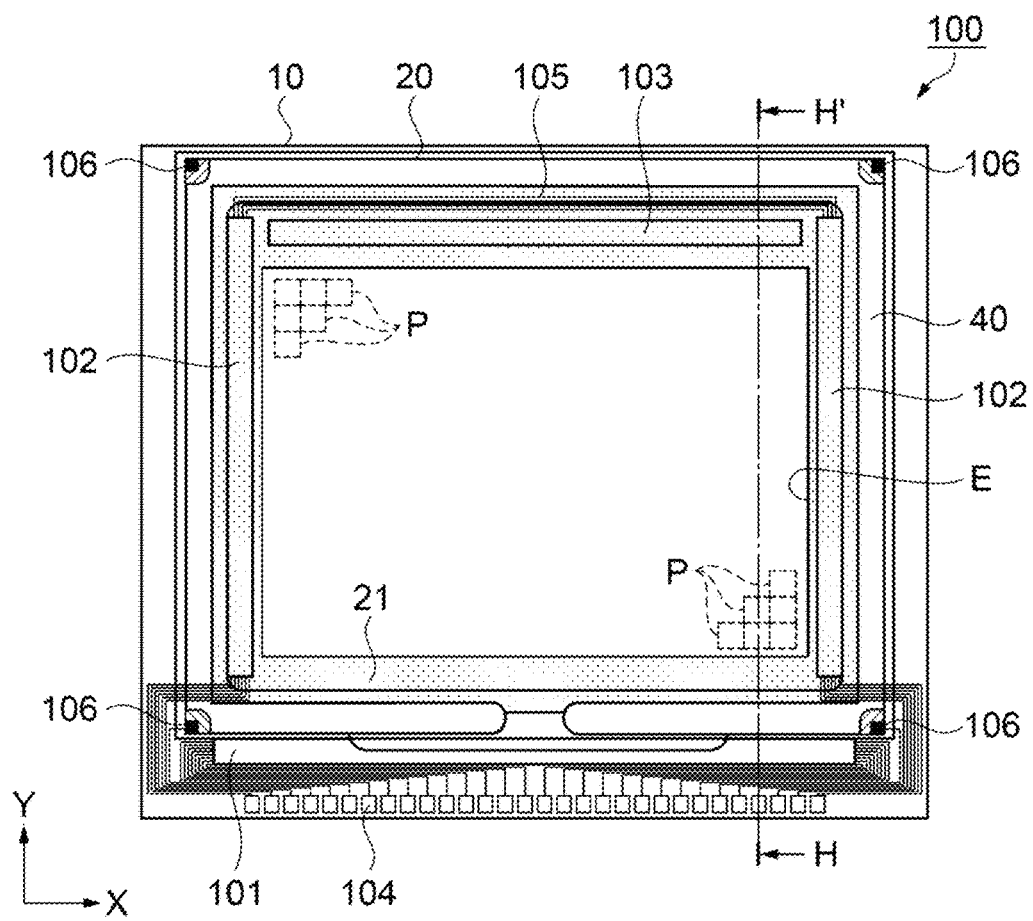
FIG. 1 is a plan view schematically illustrating a configuration of a liquid crystal device as an electro-optical device according to a first exemplary embodiment.

First, a configuration of a liquid crystal device as an electro-optical device according to a first exemplary embodiment will be described with reference to FIGS. 1 to 3. FIG. 1 is a schematic plan view illustrating a configuration of a liquid crystal device as an electro-optical device according to the first exemplary embodiment, FIG. 2 is a schematic cross-sectional view taken along line H-H' of the liquid crystal device illustrated in FIG. 1, and FIG. 3 is an equivalent circuit diagram illustrating an electrical configuration of the liquid crystal device according to the first exemplary embodiment.

Figure 2:
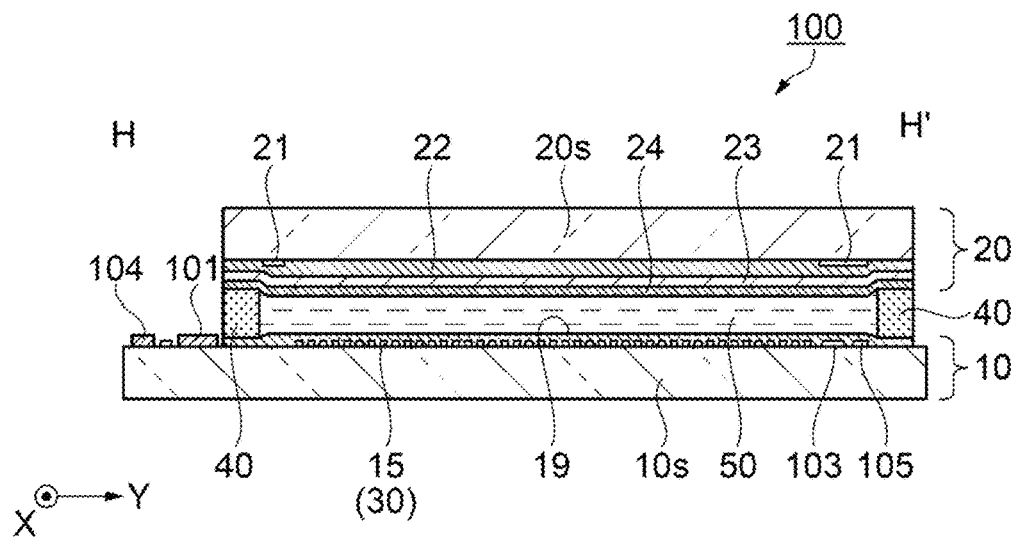
FIG. 2 is a schematic cross-sectional view taken along line H-H' of the liquid crystal device illustrated in FIG. 1.
Figure 3:
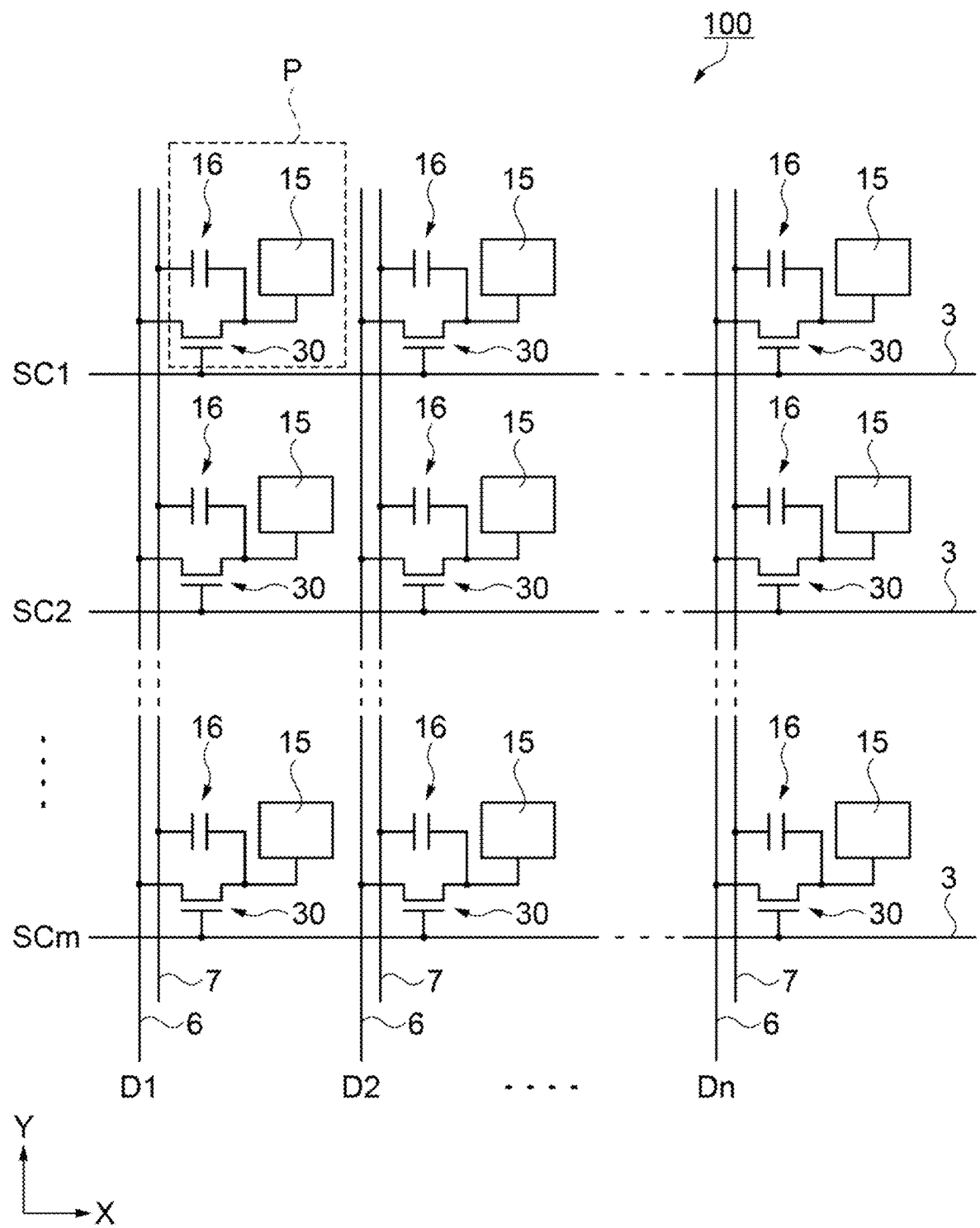
FIG. 3 is an equivalent circuit diagram illustrating an electrical configuration of the liquid crystal device of the first exemplary embodiment.

As illustrated in FIG. 1 and FIG. 2, a liquid crystal device 100 of the first exemplary embodiment includes an element substrate 10 and a counter substrate 20 disposed to face each other, and a liquid crystal layer 50 interposed between a pair of these substrates. For example, a quartz substrate or a glass substrate having a translucent property is used for each of a base substrate 10s of the element substrate 10 and a base substrate 20s of the counter substrate 20. Note that the translucent property herein refers to a property of being capable of transmitting at least 85% or greater of light in a visible light wavelength region. In addition, a light shielding property herein refers to a property of being capable of blocking at least 95% or greater of light in the visible light wavelength region.

The element substrate 10 is slightly larger than the counter substrate 20. The element substrate 10 and the counter substrate 20 are bonded to each other via a seal material 40 disposed in a frame-like shape along an outer edge portion of the counter substrate 20, and liquid crystal having positive or negative dielectric anisotropy is encapsulated in a gap between the element substrate 10 and the counter substrate 20 to constitute the liquid crystal layer 50. As the seal material 40, for example, an adhesive such as a thermosetting or ultraviolet curable epoxy resin is employed. The seal material 40 is mixed with a spacer (not illustrated) configured to keep an interval between the pair of substrates constant.

A display region E in which a plurality of pixels P are arrayed in a matrix shape is provided on an inner side of the seal material 40. In addition, on the counter substrate 20, a partition portion 21 surrounding the display region E is provided between the seal material 40 and the display region E. The partition portion 21 includes, for example, a metal or a metal compound having a light shielding property. Note that the display region E may include dummy pixels disposed to surround the plurality of pixels P in addition to the plurality of pixels P contributing to display.

The element substrate 10 is provided with a terminal portion in which a plurality of external connection terminals 104 are arrayed. A data line drive circuit 101 is provided between a first side portion along the terminal portion of the element substrate 10 and the seal material 40. In addition, an inspection circuit 103 is provided between the seal material 40 along a second side portion facing the first side portion and the display region E. Further, a pair of scanning line drive circuits 102 are provided between the seal material 40 along a third side portion and a fourth side portion orthogonal to the first side portion and facing each other and the display region E. Between the seal material 40 of the second side portion and the inspection circuit 103, a plurality of lines of wiring 105 configured to connect the two scanning line drive circuits 102 are provided.

The wiring connected to the data line drive circuit 101 and the scanning line drive circuit 102 is coupled to the plurality of external connection terminals 104 disposed along the first side portion. Hereinafter, description will be made assuming that a direction along the first side portion is an X direction, and a direction along the third side portion and the fourth side portion is a Y direction. In addition, herein, viewing perpendicularly to the X direction and the Y direction from a normal direction of the counter substrate 20 is referred to as "in a plan view" or "planarly".

As illustrated in FIG. 2, the element substrate 10 includes the base substrate 10s as an example of the substrate in the disclosure, and a TFT 30 and a pixel electrode 15 formed on a surface of the liquid crystal layer 50 side of the base substrate 10s, an alignment film 19 covering the pixel electrode 15, and the like. The TFT 30 and the pixel electrode 15 are constituent elements of each pixel P. Details of the pixel P will be described below.

The counter substrate 20 includes the base substrate 20s, and the partition portion 21, a planarization layer 22, a common electrode 23, an alignment film 24, and the like sequentially stacked on a surface of the liquid crystal layer 50 side of the base substrate 20s.

As illustrated in FIG. 1, the partition portion 21 surrounds the display region E and is provided at a position where the partition portion 21 planarly overlaps with the scanning line drive circuit 102 and the inspection circuit 103. Thus, the partition portion 21 blocks light incident on peripheral circuits including these drive circuits from the counter substrate 20 side, and has a role of preventing malfunction of the peripheral circuits due to the light. In addition, the partition portion 21 blocks light to prevent unnecessary stray light from being incident on the display region E, and ensures high contrast in display of the display region E.

The planarization layer 22 includes, for example, an inorganic material such as a silicon oxide, and the planarization layer 22 has a translucent property and is provided to cover the partition portion 21. Such a planarization layer 22 includes a silicon oxide film formed by using, for example, a plasma CVD method, and has a film thickness to such an extent that surface irregularities on the common electrode 23 to be formed on the planarization layer 22 can be mitigated.

The common electrode 23 includes a transparent conductive film such as an Indium Tin Oxide (ITO) film and an Indium Zinc Oxide (IZO) film, and the common electrode 23 covers the planarization layer 22 and is also electrically coupled to wiring on the element substrate 10 side by vertical conducting portions 106 provided on four corners of the counter substrate 20 as illustrated in FIG. 1.

The alignment film 19 covering the pixel electrode 15 and the alignment film 24 covering the common electrode 23 are set based on an optical design of the liquid crystal device 100, and as the alignment films 19 and 24, an oblique vapor deposition film (inorganic alignment film) of an inorganic material such as a silicon oxide is employed. As the alignment films 19 and 24, an organic alignment film of polyimide or the like may be employed in addition to the inorganic alignment film.

Such a liquid crystal device 100 is of a transmissive-type, and in the liquid crystal device 100, an optical design of a normally white mode in which display is bright when the pixels P are not driven or a normally black mode in which display is dark when the pixels P are not driven is employed. A polarizing element is disposed on each of the light incidence side and the light exit side in accordance with the optical design to be used. Note that the liquid crystal device 100 of the first exemplary embodiment is used as a liquid crystal light bulb of a projection-type display apparatus described below, and is configured assuming that light emitted from a light source is incident from the element substrate 10 side.

Next, an electrical configuration of the liquid crystal device 100 will be described with reference to FIG. 3. The liquid crystal device 100 includes a plurality of scanning lines 3 and a plurality of data lines 6 as signal lines insulated from one another and orthogonal to one another at least in the display region E, and a capacitance line 7.

In each of regions partitioned by the scanning lines 3 and the data lines 6, the pixel electrode 15, the TFT 30, and a holding capacitor 16 are provided, and constitute a pixel circuit of the pixel P.

Each scanning line 3 is electrically coupled to a gate of the TFT 30, each data line 6 is electrically coupled to a source of the TFT 30, and the pixel electrode 15 is electrically coupled to a drain of the TFT 30.

The data lines 6 are coupled to the data line drive circuit 101 (see FIG. 1). Image signals D1, D2, ..., Dn are supplied from the data line drive circuit 101 to each pixel P via the data lines 6. The scanning lines 3 are coupled to the scanning line drive circuit 102 (see FIG. 1). Scanning signals SC1, SC2, ..., SCm are supplied from the scanning line driver circuit 102 to each pixel P via the scanning lines 3.

The image signals D1 to Dn supplied from the data line drive circuit 101 may be line-sequentially supplied to the data lines 6 in this order or may be supplied to the plurality of data lines 6 adjacent to one another in groups. The scanning line drive circuit 102 line-sequentially supplies the scanning signals SC1 to SCm to the scanning lines 3 in a pulsed manner at predetermined timing.

In the liquid crystal device 100, the TFT 30 as a switching element is turned on only for a certain period by an input of the scanning signals SC1 to SCm and thus, the image signals D1 to Dn supplied from the data lines 6 are written in the pixel electrodes 15 at predetermined timing. Then, the image signals D1 to Dn at predetermined level written in the liquid crystal layer 50 via the pixel electrodes 15 are held for a certain period between the pixel electrodes 15 and the common electrode 23.

To prevent the image signals D1 to Dn held from leaking, the holding capacitor 16 is coupled in parallel with liquid crystal capacitance formed between the pixel electrode 15 and the common electrode 23. The holding capacitor 16 is provided between the drain of the TFT 30 and the capacitance line 7.

Note that although the inspection circuit 103 illustrated in FIG. 1 is coupled to the data lines 6, and is configured to be capable of detecting the image signals described above to confirm operational defects and the like of the liquid crystal device 100 in a manufacturing process of the liquid crystal device 100, this configuration is omitted in the equivalent circuit of FIG. 3.

In addition, the inspection circuit 103 may include a sampling circuit configured to sample the image signals described above and to supply the image signals to the data lines 6, and a precharge circuit configured to supply precharge signals at predetermined voltage level to the data lines 6 in advance of the supply of the image signals.

Figure 4:
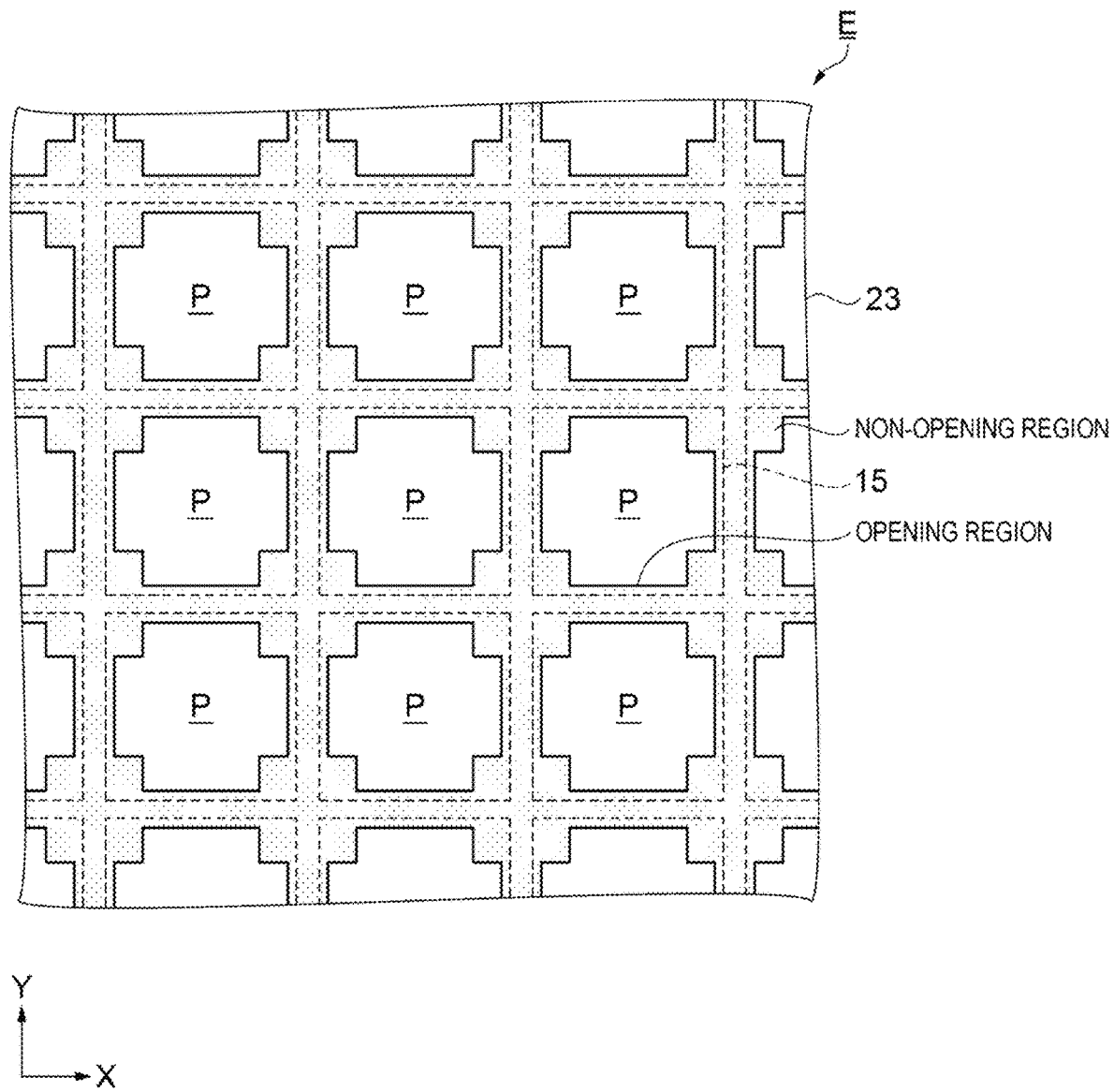
FIG. 4 is a schematic plan view illustrating disposition of pixels in the liquid crystal device of the first exemplary embodiment.

Next, a configuration of the pixel P in the liquid crystal device 100 will be described with reference to FIG. 4. FIG. 4 is a schematic plan view illustrating disposition of pixels in the liquid crystal device of the first exemplary embodiment. Note that FIG. 4 is the schematic plan view as viewing the element substrate 10 from the light incident side.

As illustrated in FIG. 4, the pixel P in the liquid crystal device 100 includes an opening region having, for example, a substantially quadrangle shape (substantially square shape) in a plan view. The opening region is surrounded by non-opening regions each having a light shielding property and extending in the X direction and in the Y direction to be provided in a lattice pattern.

In the non-opening regions extending in the X direction, the scanning lines 3 illustrated in FIG. 3 are provided. A conductive member having a light shielding property is used for each scanning line 3, and the non-opening regions partially include the scanning lines 3.

Similarly, in the non-opening regions extending in the Y direction, the data lines 6 illustrated in FIG. 3 are provided. A conductive member having a light shielding property is also used for each data line 6, and the non-opening regions partially include the scanning lines 3 and the data lines 6.

At an intersection of the non-opening regions, the TFT 30 and the holding capacitor 16 illustrated in FIG. 3 are provided. The TFT 30 and the holding capacitor 16 are provided at the intersection of the non-opening regions each having a light shielding property and thus, occurrence of a light leakage current of the TFT 30 is suppressed, and an aperture ratio in the opening region is ensured. Although a detailed structure of the pixel P will be described below, since the TFT 30 and the holding capacitor 16 are provided at the intersection, widths in the X direction and in the Y direction of the intersection of the non-opening regions are greater than widths of other portions.

The holding capacitor 16 includes a first capacitance electrode and a second capacitance electrode disposed to face each other via a capacitance insulation film. The first capacitance electrode is provided for each pixel P in an electrically independent manner. The second capacitance electrode is provided to the plurality of pixels P in an electrically common manner. The second capacitance electrode extends in the X direction and in the Y direction in the non-opening regions to form a lattice pattern, and functions as the capacitance line 7 to which a fixed potential is applied in common with the plurality of pixels P illustrated in FIG. 3. In other words, the capacitance line 7 extends in the X direction and in the Y direction to partially constitute the non-opening regions of a lattice pattern.

The pixel electrode 15 is provided for each of the pixels P. The pixel electrode 15 has a substantially square shape in a plan view, and is provided in the opening region to cause an outer edge of the pixel electrode 15 to overlap with the non-opening regions. The common electrode 23 is provided across the opening region and the non-opening regions to overlap in a plan view with the pixel electrode 15 of each pixel P.

The liquid crystal device 100 of the first exemplary embodiment is of a transmissive-type. As described above, assuming that light is incident from the element substrate 10 side, a light shielding structure configured to prevent light incident on the pixel P from entering the TFT 30 is introduced to the element substrate 10. In addition, the light shielding structure includes the scanning lines 3, the data lines 6, and the holding capacitor 16 described above. Hereinafter, a configuration related to the wiring of the element substrate 10 will be described.

Configuration of Element Substrate

Figure 5:
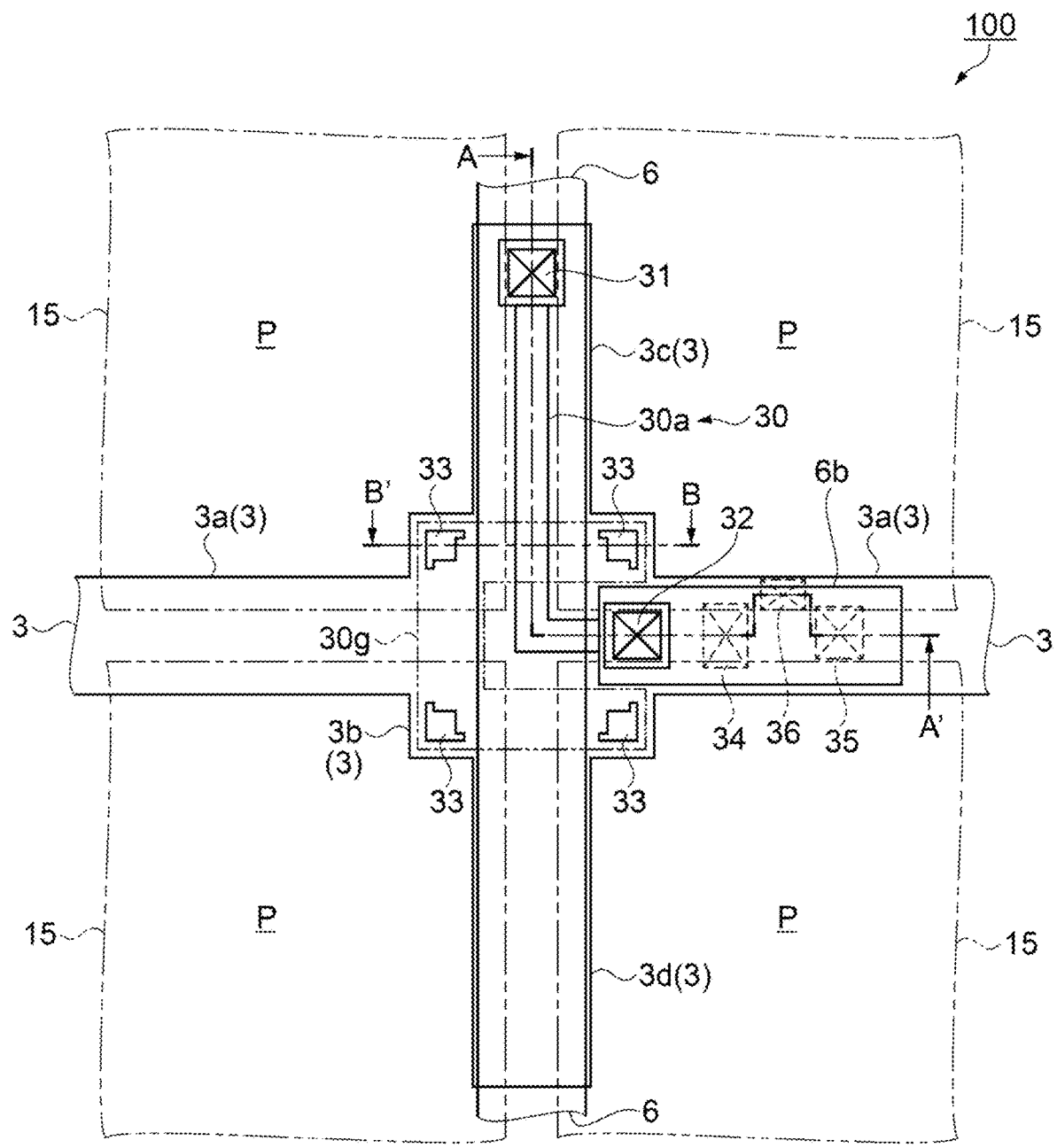
FIG. 5 is a schematic plan view illustrating disposition of a TFT, wiring, and the like at an intersection of non-opening regions of the liquid crystal device of the first exemplary embodiment.
Figure 6:
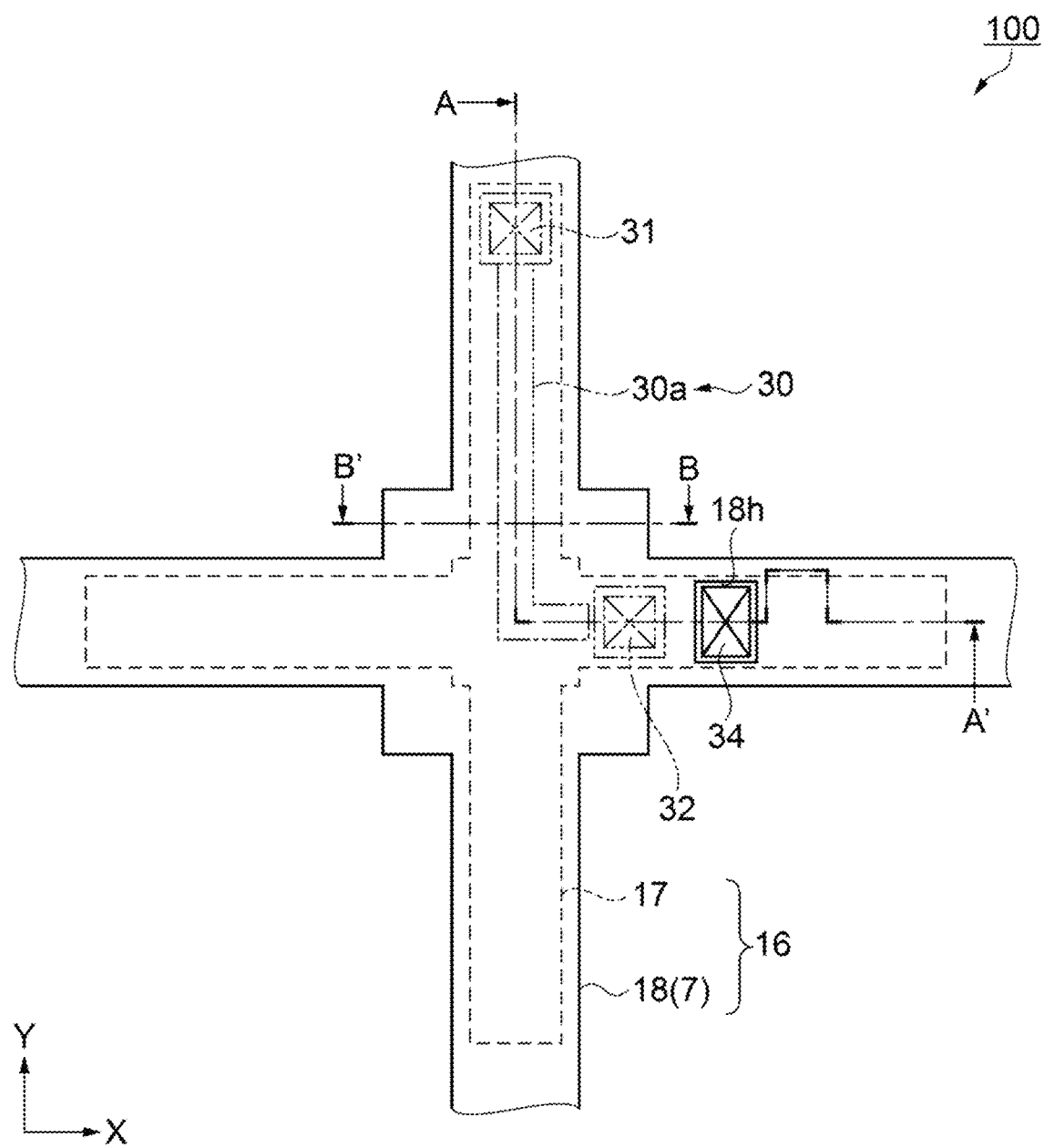
FIG. 6 is a schematic plan view illustrating disposition of a capacitance electrode at the intersection of the non-opening regions of the liquid crystal device of the first exemplary embodiment.

First, planar disposition of the TFT 30 and the holding capacitor 16 at the intersection of the non-opening regions described above will be described with reference to FIGS. 5 and 6. FIG. 5 is a schematic plan view illustrating disposition of the TFT, the wiring and the like at the intersection of non-opening regions of the liquid crystal device of the first exemplary embodiment, and FIG. 6 is a schematic plan view illustrating disposition of the capacitance electrode at the intersection of the non-opening regions of the liquid crystal device of the first exemplary embodiment.

As illustrated in FIG. 5, in the liquid crystal device 100 of the first exemplary embodiment, the TFT 30 is disposed at the intersection of the non-opening regions surrounding the opening region of the pixel P in which the pixel electrode 15 is disposed. The scanning line 3 electrically coupled to the TFT 30 is configured to include a main line portion 3a extending in the X direction across the plurality of pixels P, an extended portion 3b having widths in the X direction and in the Y direction extended greater than widths of the main line portion 3a, corresponding to the intersection of the non-opening regions, a protruding portion 3c protruding upward in the Y direction from the extended portion 3b in the drawing, and a protruding portion 3d protruding downward in the Y direction from the extended portion 3b similarly in the drawing.

A semiconductor layer 30a of the TFT 30 is disposed to planarly overlap with such a scanning line 3. Specifically, the semiconductor layer 30a bends at the intersection of the non-opening regions, namely, at the center of the extended portion 3b of the scanning line 3, and includes a portion extending in the X direction and a portion extending in the Y direction. A drain contact 32 functioning as a drain electrode is provided on the leading end side of the portion extending in the X direction of the semiconductor layer 30a. The portion extending in the X direction of the semiconductor layer 30a planarly overlaps with the main line portion 3a described above of the scanning line 3. A source contact 31 functioning as a source electrode is provided on the leading end side of the portion extending in the Y direction of the semiconductor layer 30a. The portion extending in the Y direction of the semiconductor layer 30a planarly overlaps with the above-described protruding portion 3c of the scanning line 3. In other words, the protruding portion 3c extends in the Y direction to a position where the protruding portion 3c planarly overlaps with the source contact 31 of the semiconductor layer 30a.

The data line 6 electrically coupled to the TFT 30 planarly overlaps with the intersection of the non-opening regions and extends in the Y direction across the plurality of pixels P. The data line 6 is coupled to the semiconductor layer 30a of the TFT 30 via the source contact 31.

As described in detail below, the semiconductor layer 30a and a gate electrode 30g are provided between the scanning line 3 and the data line 6 on the base substrate 10s. The gate electrode 30g is disposed to planarly overlap with the intersection of the non-opening regions. The gate electrode 30g includes a portion extending in the Y direction in parallel with the semiconductor layer 30a in a plan view, and portions extending in the X direction respectively from both ends of the portion extending in the Y direction. In FIG. 5, a portion extending in the X direction and located upward in the Y direction in the drawing of a pair of the portions extending in the X direction of the gate electrode 30g planarly overlaps with the semiconductor layer 30a. The portion of the semiconductor layer 30a planarly overlapping with the gate electrode 30g serves as a channel region. In other words, the gate electrode 30g is disposed to planarly overlap with the channel region of the semiconductor layer 30a.

The gate electrode 30g provided to planarly overlap with the intersection of the non-opening regions, namely, the extended portion 3b of the scanning line 3 is coupled to the scanning line 3 via gate contacts 33 disposed corresponding to four corners of the extended portion 3b.

As described in detail below, on the base substrate 10s, a first relay layer 6b is provided in a wiring layer in which the data line 6 is provided. The first relay layer 6b has an island shape electrically independent. The first relay layer 6b is disposed extending in the X direction to planarly overlap with the drain contact 32 of the TFT 30 at a position spaced apart from the data line 6 in the X direction. In addition, the first relay layer 6b is disposed to planarly overlap with a contact hole 34 related to coupling with the holding capacitor 16 and two contact holes 35 and 36 related to coupling with the pixel electrode 15.

The contact hole 36 is located in the non-opening region surrounding the opening region, and is located at a position where the contact hole 36 planarly overlaps with the outer edge of the pixel electrode 15 disposed to partially cover the non-opening region. As described in detail below, the pixel electrode 15 is coupled to the semiconductor layer 30a of the TFT 30 via the contact hole 36, the contact hole 35, the first relay layer 6b, and the drain contact 32. That is, in the first exemplary embodiment, as illustrated in FIG. 5, the TFT 30 configured to switch-control the pixel electrode 15 of the pixel P at the upper right in the drawing with respect to the extended portion 3b of the scanning line 3 constituting the intersection of the non-opening regions is disposed to planarly overlap with the extended portion 3b. Similar disposition of the TFT 30 is employed in each of the other pixels P.

Note that the disposition of the TFT 30 in the pixel P is not limited to the disposition described above. Disposition where the semiconductor layer 30a is not bent and the TFT 30 extends in the X direction along the main line portion 3a of the scanning line 3, or disposition where the TFT 30 extends in the Y direction along the data line 6 can also be employed.

As illustrated in FIG. 6, the holding capacitor 16 includes a first capacitance electrode 17 and a second capacitance electrode 18 disposed to face each other via a capacitance insulation film. In addition, as described above, the holding capacitor 16 is provided corresponding to the intersection of the non-opening regions. Specifically, the first capacitance electrode 17 of the holding capacitor 16 is provided independently for each pixel P corresponding to the intersection of the non-opening regions. The first capacitance electrode 17 includes portions extending to both sides in the X direction (the right side and the left side in the drawing) and portions extending to both sides in the Y direction (the upper side and the lower side in the drawing), and has a cross-shaped outline.

The portion extending to the right side in the X direction of the first capacitance electrode 17 planarly overlaps with the drain contact 32 of the TFT 30 and planarly overlaps with the contact hole 34 related to coupling with the TFT 30. In addition, the portion extending to the upper side in the Y direction of the first capacitance electrode 17 extends to a position where the portion planarly overlaps with the source contact 31 of the TFT 30.

The second capacitance electrode 18 disposed to face such a first capacitance electrode 17 via the capacitance insulation film has widths in the X direction and in the Y direction greater (wider) than widths of the first capacitance electrode 17. Then, the second capacitance electrode 18 is provided corresponding to the intersection of the non-opening regions and extends in the X direction and in the Y direction across the plurality of pixels P. In other words, the second capacitance electrode 18 is formed in a lattice pattern at least in the display region E as the non-opening regions illustrated in FIG. 4, and electrically functions as the capacitance line 7 illustrated in FIG. 3.

The portion extending to the right side in the X direction from the intersection of the second capacitance electrodes 18 is provided with an opening portion 18h at a position where the opening portion 18h planarly overlaps with the contact hole 34 configured to couple the first capacitance electrode 17 to the TFT 30.

Figure 7:
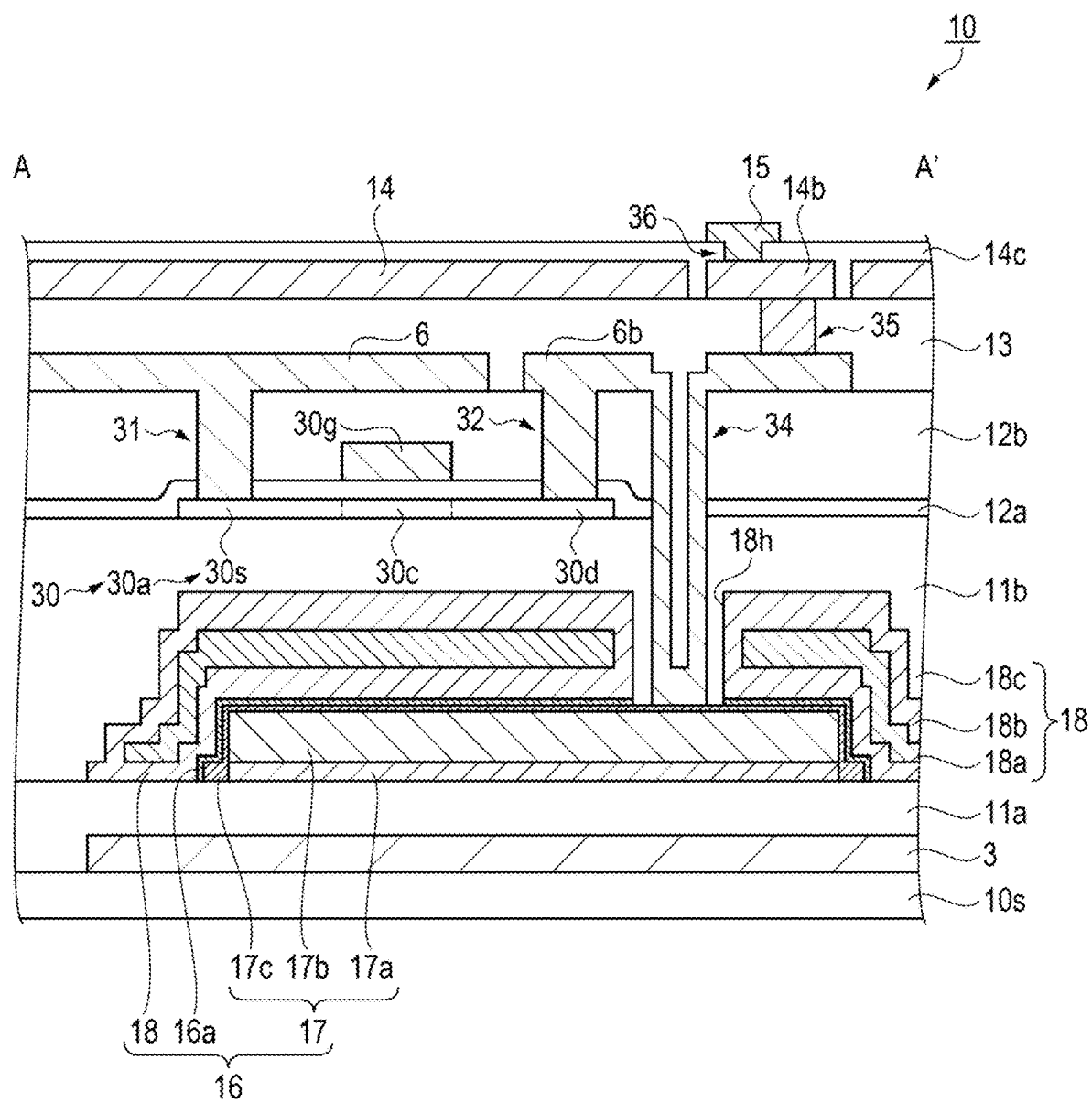
FIG. 7 is a schematic cross-sectional view illustrating a structure of an element substrate taken along line A-A' in FIGS. 5 and 6.
Figure 8:
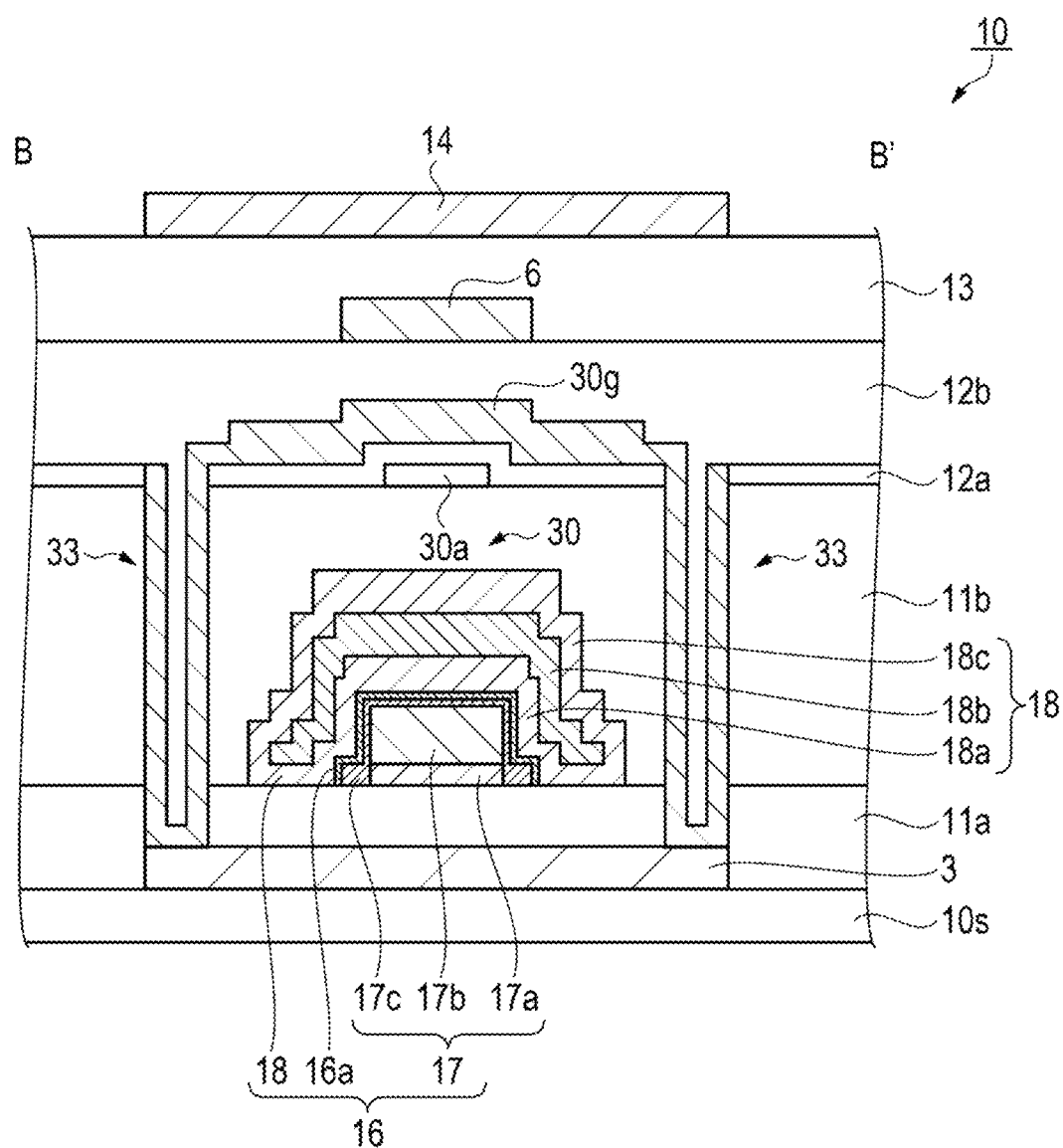
FIG. 8 is a schematic cross-sectional view illustrating a structure of the element substrate taken along line B-B' in FIGS. 5 and 6.

Next, a structure of the element substrate 10 will be described with reference to FIGS. 7 and 8. FIG. 7 is a schematic cross-sectional view illustrating a structure of the element substrate taken along line A-A' in FIGS. 5 and 6, and FIG. 8 is a schematic cross-sectional view illustrating a structure of the element substrate taken along line B-B' in FIGS. 5 and 6. Line A-A' is a line segment traversing the semiconductor layer 30a and the contact holes 34, 36, and 35. Line B-B' is a line segment traversing, in the X direction, the two gate contacts 33 aligned in the X direction.

As illustrated in FIG. 7, the scanning line 3 is firstly formed on the base substrate 10s. The base substrate 10s of the element substrate 10 is, for example, a quartz substrate. The scanning line 3 is formed of a single metal, an alloy, metal silicide, polysilicide, or a stacked body of these metals including at least one of high melting point metals such as Ti, Cr, Mo, Ta, and W, or non-crystalline silicon (amorphous silicon), polysilicon, or the like. In particular, from the viewpoint of blocking light incident from the base substrate 10s side and preventing light incident from the counter substrate 20 side from being reflected, the scanning line 3 is preferably formed by using metal silicide, and in the first exemplary embodiment, the scanning line 3 is formed by using tungsten silicide (WSix). A film thickness of the scanning line 3 ranges, for example, from 200 nm to 500 nm.

Next, a first interlayer insulation film 11a covering the scanning lines 3 is formed. The first interlayer insulation film 11a is formed, for example, by using a silicon oxide film (None-doped Silicate Glass; NSG film) or a silicon nitride film in which no impurities are intentionally introduced to prevent impurities from diffusing even when the film is subsequently subjected to a heat treatment at 600° C. or greater. Examples of a method of forming the first interlayer insulation film 11a can include an atmospheric pressure CVD method, a low-pressure CVD method, or a plasma CVD method using a processing gas such as monosilane ($SiH_4$), dichlorosilane ($SiCl_2H_2$), tetraethoxysilane (TEOS), and ammonia. A film thickness of the first interlayer insulation film 11a ranges, for example, from 200 nm to 500 nm.

Subsequently, the holding capacitor 16 is formed on the first interlayer insulation film 11a. Although details of a method of forming the holding capacitor 16 will be described below, the first capacitance electrode 17 is firstly formed, and next, a capacitance insulation film 16a is formed to cover the first capacitance electrode 17. Then, the second capacitance electrode 18 is formed to face the first capacitance electrode 17 via the capacitance insulation film 16a.

The first capacitance electrode 17 includes a first electrode layer 17a, a second electrode layer 17b, and a third electrode layer 17c stacked one on another in this order. The first electrode layer 17a contains tungsten silicide (WSix), and a film thickness of the first electrode layer 17a is, for example, 50 nm. The second electrode layer 17b contains silicide of titanium (Ti) as a metal more stabilized through silicidation than tungsten (W), and a film thickness of the second electrode layer 17b is, for example, 150 nm. The third electrode layer 17c contains silicon, and a film thickness of the third electrode layer 17c is, for example, approximately 5 nm. In addition, a surface including side surfaces and an upper surface of the first electrode layer 17a and the second electrode layer 17b stacked one on another is covered with the third electrode layer 17c.

Note that examples of the metal more stabilized through silicidation than tungsten (W) include hafnium (Hf) and zirconium (Zr) in addition to titanium (Ti). According to the literature of Applied Physics Vol. 63, No. 11 (Pages 1095 and 1096) issued in 1994 by The Japan Society of Applied Physics, formation heat in silicidation of tungsten (W) is approximately −10 kJ (kilojoules)/mol, whereas formation heat in silicidation of titanium (Ti), hafnium (Hf), and zirconium (Zr) ranges from −50 kJ/mol to −90 kJ/mol. In addition, formation heat in oxidation of tungsten (W) is approximately −200 kJ/mol, and formation heat in oxidation of silicon (Si) is approximately −300 kJ/mol, whereas formation heat in oxidation of titanium (Ti), hafnium (Hf), and zirconium (Zr) ranges from −310 kJ/mol to −370 kJ/mol. That is, titanium (Ti), hafnium (Hf), and zirconium (Zr) are metals undergoing silicidation or oxidation to be more stabilized than tungsten (W), and are also metals more stabilized through oxidization than silicon (Si). Although other examples of the metal more stabilized through silicidation than tungsten (W) include vanadium (V) and tantalum (Ta), formation heat in silicidation of vanadium (V) is approximately −30 kJ/mol, and formation heat in silicidation of tantalum (Ta) is approximately −40 kJ/mol and thus, titanium (Ti), hafnium (Hf), and zirconium (Zr) can be mentioned as the metals more stabilized through silicidation than vanadium (V) and tantalum (Ta).

The capacitance insulation film 16a can be formed by using a silicon oxide film or a silicon nitride film. In addition, the capacitance insulation film 16a may be formed by using a dielectric film having a high dielectric constant such as an aluminum oxide film, a titanium oxide film, a tantalum oxide film, a niobium oxide film, a hafnium oxide film, a lanthanum oxide film, and a zirconium oxide film. Further, some dielectric films may be selected from these dielectric films and may be stacked one on another to form the capacitance insulation film 16a. Particularly, the capacitance insulation film 16a is preferably formed by using a silicon oxide film or a silicon nitride film difficult to thermally change even when the film is subjected to a heat treatment at, for example, 600° C. or greater. Further, since the capacitance insulation film 16a is in contact with the first capacitance electrode 17 and the second capacitance electrode 18, the capacitance insulation film 16a is more preferably formed by using the silicon nitride film difficult to oxidize the first capacitance electrode 17 and the second capacitance electrode 18 when the film is subjected to a heat treatment. In a case where these silicon compound films are used as the capacitance insulation film 16a, a film thickness of the capacitance insulation film 16a ranges, for example, approximately from 5 nm to 20 nm, in consideration of electric capacitance of the holding capacitor 16.

The second capacitance electrode 18 includes a fourth electrode layer 18a, a fifth electrode layer 18b, and a sixth electrode layer 18c stacked one on another in this order. The fourth electrode layer 18a contains tungsten silicide (WSix), and a film thickness of the fourth electrode layer 18a is, for example, 50 nm. The fifth electrode layer 18b contains silicide of titanium (Ti) as a metal more stabilized through silicidation than tungsten, and a film thickness of the fifth electrode layer 18b is, for example, 100 nm. The sixth electrode layer 18c contains tungsten silicide (WSix), and a film thickness of the sixth electrode layer 18c is, for example, 100 nm. Note that, as described above, examples of the metal more stabilized through silicidation than tungsten include hafnium (Hf) and zirconium (Zr) in addition to titanium (Ti). In addition, side surfaces and an upper surface excluding a bottom surface of the fifth electrode layer 18b are covered with the sixth electrode layer 18c.

In the second capacitance electrode 18, the opening portion 18h provided with the contact hole 34 configured to couple the first capacitance electrode 17 located in a lower layer to the TFT 30 is formed. An inner wall excluding a bottom surface of the opening portion 18h is covered with the sixth electrode layer 18c. A detailed method of forming such a second capacitance electrode 18 will also be described in a method of forming the holding capacitor 16 described below.

Next, a second interlayer insulation film 11b is formed to cover the holding capacitor 16. As with the first interlayer insulation film 11a, the second interlayer insulation film 11b is also formed by using, for example, a silicon oxide film (NSG film) or a silicon nitride film in which no impurities are intentionally introduced. The second interlayer insulation film 11b covers the holding capacitor 16 and thus, irregularities are caused on a surface of the second interlayer insulation film 11b. Thus, to mitigate the irregularities to achieve planarization in view of subsequent formation of the semiconductor layer 30a of the TFT 30, the second interlayer insulation film 11b is subjected to planarization processing such as Chemical Mechanical Polishing (CMP) processing and etching processing. A film thickness of the second interlayer insulation film 11b obtained after the planarization processing ranges, for example, from 200 nm to 500 nm.

The semiconductor layer 30a of the TFT 30 is formed on the second interlayer insulation film 11b subjected to the planarization processing. The semiconductor layer 30a includes a polysilicon film obtained by crystallizing an amorphous silicon film deposited by, for example, a low-pressure CVD method. Impurity ions are selectively implanted into the polysilicon film to constitute a Lightly-Doped Drain (LDD) structure including a source region 30s, a channel region 30c, and a drain region 30d. A film thickness of the semiconductor layer 30a ranges, for example, from 30 nm to 70 nm.

Next, a gate insulating film 12a is formed to cover the semiconductor layer 30a. The gate insulating film 12a includes a double-layer structure of, for example, a first silicon oxide film obtained by thermally oxidizing a semiconductor film of silicon and a second silicon oxide film formed under a high-temperature condition of from 700° C. to 900° C. by using a low-pressure CVD method. A film thickness of the gate insulating film 12a ranges, for example, approximately from 50 nm to 100 nm.

Next, the gate electrode 30g is formed on the gate insulating film 12a. The gate electrode 30g is formed by using a conductive polysilicon film, a metal silicide film, a metal film, a metal compound film, or the like. In the first exemplary embodiment, the gate electrode 30g includes a double-layer structure of a conductive polysilicon film and a tungsten silicide film. The conductive polysilicon film is formed to contain phosphorus atoms at concentration of $1 \times 10^{19}$ pieces/cm$^3$ or greater by depositing a polysilicon film doped with phosphorus (P) by a low-pressure CVD method, and subsequently performing a phosphorus diffusion treatment. As described above, the gate electrode 30g is patterned to overlap in a plan view with the channel region 30c of the semiconductor layer 30a.

Note that prior to the formation of the gate electrode 30g on the gate insulating film 12a, a plurality of through holes penetrating the gate insulating film 12a, the second interlayer insulation film 11b, and the first interlayer insulation film 11a to reach the scanning line 3 as illustrated in FIG. 8 is formed by, for example, dry etching. The gate electrode 30g and the gate contact 33 are formed by forming and patterning the metal compound film described above to cover inner sides of the through holes. As illustrated in FIG. 5, four gate contacts 33 are formed planarly corresponding to corners of the extended portion 3b of the scanning line 3, and the scanning line 3 is electrically coupled to the gate electrode 30g via the four gate contacts 33.

Again with reference to FIG. 7, a third interlayer insulation film 12b is formed to cover the gate electrode 30g. The third interlayer insulation film 12b is formed by using a silicon-based oxide film such as the NSG film described above, or a Phospho Silicate Glass (PSG) film containing phosphorus (P), a Boro Silicate Glass (BSG) film containing boron, and a Boro-Phospho Silicate Glass (BPSG) film containing boron (B) and phosphorus (P). Examples of a method of forming these silicon-based oxide films can include an atmospheric pressure CVD method, a low-pressure CVD method, and a plasma CVD method using TEOS, triethylborane (TEB), tetramethyl oxyphosphate (TMOP), or the like. A film thickness of the third interlayer insulation film 12b ranges, for example, from 200 nm to 500 nm. Note that the third interlayer insulation film 12b may also be subjected to the planarization processing as with the second interlayer insulation film 1ib.

Next, a through hole penetrating the third interlayer insulation film 12b and the gate insulating film 12a to reach each of the source region 30s and the drain region 30d of the semiconductor layer 30a is formed by, for example, dry etching. In addition, a through hole penetrating the third interlayer insulation film 12b, the gate insulating film 12a, and the second interlayer insulation film 11b to reach the first capacitance electrode 17 of the holding capacitor 16 is formed by, for example, dry etching. Since the latter through hole has a depth greater than a depth of the former through hole, formation of the former through hole and the latter through hole is separately performed. Then, a low resistance conductive film is formed and patterned to cover the inner side of each of these through holes and to cover a surface of the third interlayer insulation film 12b, and thus, the source contact 31, the data line 6, the drain contact 32, the first relay layer 6b, and the contact hole 34 are formed. The source region 30s of the semiconductor layer 30a is electrically coupled to the data line 6 via the source contact 31. The drain region 30d of the semiconductor layer 30a is electrically coupled to the first relay layer 6b via the drain contact 32, and further, the first capacitance electrode 17 is electrically coupled to the drain region 30d of the semiconductor layer 30a via the contact hole 34 coupled to the first relay layer 6b.

Examples of the low resistance conductive film constituting the data line 6 and the first relay layer 6b can include an aluminum alloy film, and a stacked film of an aluminum film and a titanium nitride film.

Next, a fourth interlayer insulation film 13 is formed to cover the data line 6 and the first relay layer 6b. As with the third interlayer insulation film 12b, the fourth interlayer insulation film 13 is also formed by using a silicon-based oxide film such as an NSG film, a PSG film, a BSG film, and a BPSG film.

Next, a through hole penetrating the fourth interlayer insulation film 13 to reach the first relay layer 6b is formed by, for example, dry etching, and a low resistance conductive film embedded in the through hole and also covering a surface of the fourth interlayer insulation film 13 is formed. This low resistance conductive film can also be formed, for example, by using an aluminum alloy film, a stacked film of an aluminum film and a titanium nitride film, or the like. The conductive film is patterned to form a shield layer 14, a second relay layer 14b, and the contact hole 35. The first relay layer 6b is electrically coupled to the second relay layer 14b via the contact hole 35. Note that the shield layer 14 is formed to planarly overlap with the data line 6, and a fixed potential is applied to the shield layer 14. Thus, the configuration where influence of a high-potential image signal supplied to the data line 6 on the liquid crystal layer 50 can be suppressed electrically by the shield layer 14 is employed, but the shield layer 14 is not an indispensable configuration in the element substrate 10.

Next, a fifth interlayer insulation film 14c is formed to cover the shield layer 14 and the second relay layer 14b. As with the third interlayer insulation film 12b, the fifth interlayer insulation film 14c is also formed by using a silicon-based oxide film such as an NSG film, a PSG film, a BSG film, and a BPSG film. In the fifth interlayer insulation film 14c, a through hole reaching the second relay layer 14b is formed by, for example, dry etching. A transparent conductive film such as an ITO film is formed on the fifth interlayer insulation film 14c and covers the inner side of the through hole. Then, the transparent conductive film is patterned to form the pixel electrode 15 and the contact hole 36. The pixel electrode 15 is coupled to the second relay layer 14b via the contact hole 36. That is, the pixel electrode 15 is electrically coupled to the drain region 30d of the semiconductor layer 30a via the contact hole 36, the second relay layer 14b, the contact hole 35, the first relay layer 6b, and the drain contact 32.

Method of Manufacturing Electro-Optical Device

Figure 9:
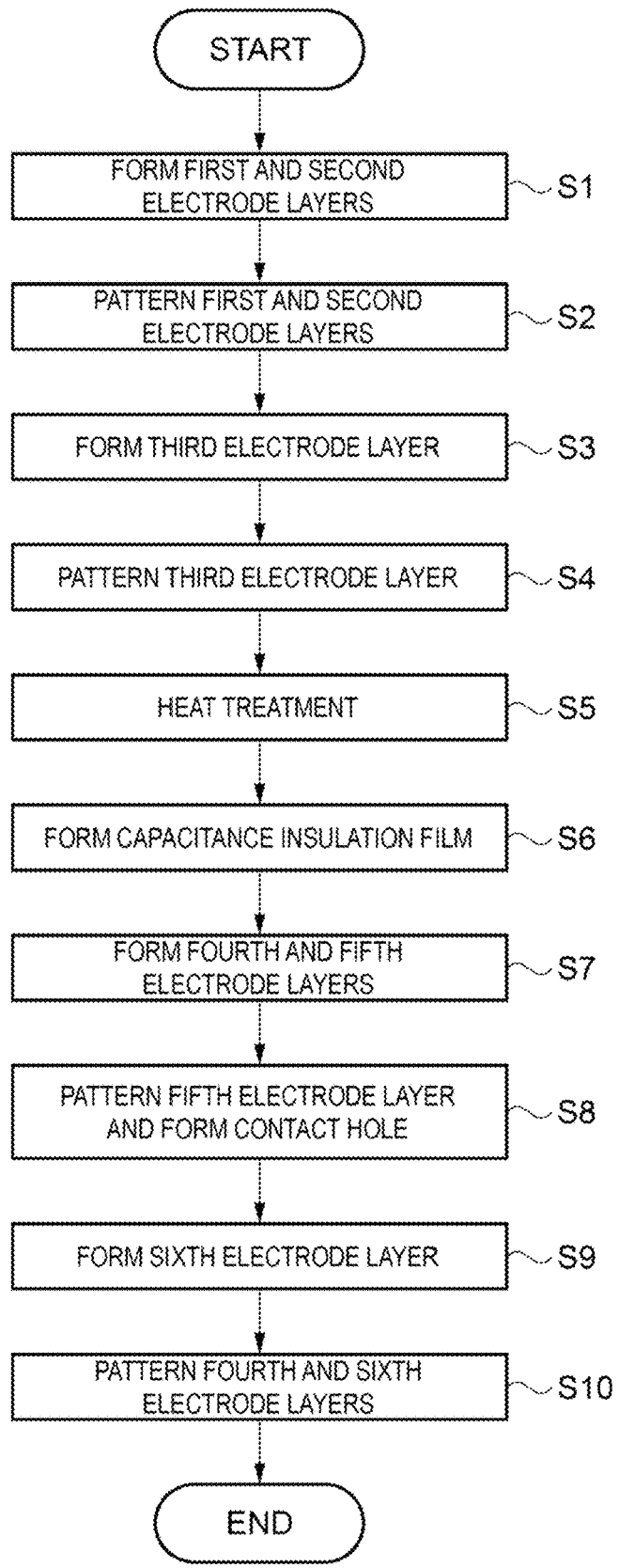
FIG. 9 is a flowchart illustrating a method of forming a holding capacitor according to the first exemplary embodiment.

Next, a method of manufacturing the liquid crystal device 100 as an electro-optical device according to the first exemplary embodiment includes a step of forming the holding capacitor 16 on the base substrate 10s as a substrate in the element substrate 10 and subsequently forming the TFT 30 as a transistor to overlap in a plan view with the holding capacitor 16 via the second interlayer insulation film 11b as an interlayer insulation film, and has a feature in a method of forming the holding capacitor 16. Accordingly, the method of forming the holding capacitor 16 as the feature will be described with reference to FIGS. 9 to 21. FIG. 9 is a flowchart illustrating the method of forming the holding capacitor according to the first exemplary embodiment. FIGS. 10 to 21 are schematic cross-sectional views illustrating respective steps in the method of forming the holding capacitor according to the first exemplary embodiment. Note that formation of one holding capacitor 16 will be described with reference to the figures, but in actual manufacturing of the element substrate 10, the holding capacitor 16 is formed for each pixel P and a plurality of the element substrates 10 are simultaneously formed by using a mother substrate.

As illustrated in FIG. 9, the method of forming the holding capacitor 16 includes a step of forming the first and second electrode layers (step S1), a step of patterning the first and second electrode layers (step S2), a step of forming the third electrode layer (step S3), a step of patterning the third electrode layer (step S4), and a heat treatment step (step S5). Further, the method includes a step of forming the capacitance insulation film (step S6), a step of forming the fourth and fifth electrode layers (step S7), a step of patterning the fifth electrode layer and forming the contact hole (step S8), a step of film depositing the sixth electrode layer (step S9), and a step of patterning the fourth and sixth electrode layers (step S10). Steps S1 to S5 correspond to a step of forming the first capacitance electrode 17 of the holding capacitor 16. Steps S7 to S10 correspond to a step of forming the second capacitance electrode 18 of the holding capacitor 16. In addition, the heat treatment step at step S5 is a step of silicidizing the second electrode layer formed by using a metal more stabilized through silicidation than tungsten.

Figure 10:
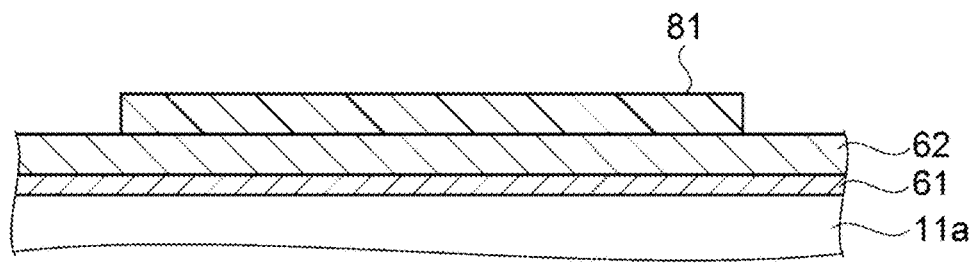
FIG. 10 is a schematic cross-sectional view illustrating each step in the method of forming a holding capacitor according to the first exemplary embodiment.

At step S1, as illustrated in FIG. 10, a tungsten silicide film 61 to be the first electrode layer 17a is formed on the first interlayer insulation film 11a, and subsequently a titanium film 62 as a metal film stacked on the tungsten silicide film 61 to be the second electrode layer 17b is formed. Examples of the method of forming these films include a sputtering method, a vapor deposition method, and a metal CVD method targeting materials of the respective films. A film thickness of the tungsten silicide film 61 is, for example, 50 nm, and a film thickness of the titanium film 62 is, for example, 100 nm. Note that the metal film to be the second electrode layer 17b is a film of a metal more stabilized through silicidation than tungsten, and may be a hafnium film or a zirconium film. Then, the process proceeds to step S2.

Figure 11:
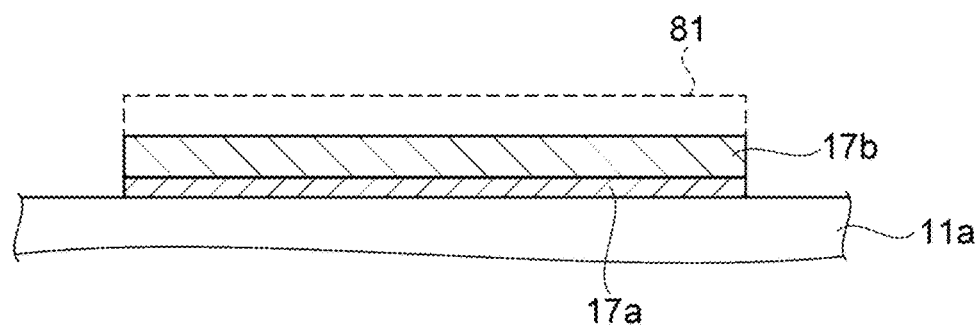
FIG. 11 is a schematic cross-sectional view illustrating each step in the method of forming a holding capacitor according to the first exemplary embodiment.

At step S2, as illustrated in FIG. 10, a resist pattern 81 is formed on the titanium film 62 by photolithography. Then, the titanium film 62 and the tungsten silicide film 61 are etched and patterned via the resist pattern 81 and thus, as illustrated in FIG. 11, the first electrode layer 17a containing tungsten silicide and the second electrode layer 17b containing titanium (Ti) are formed. Then, the process proceeds to step S3.

Figure 12:
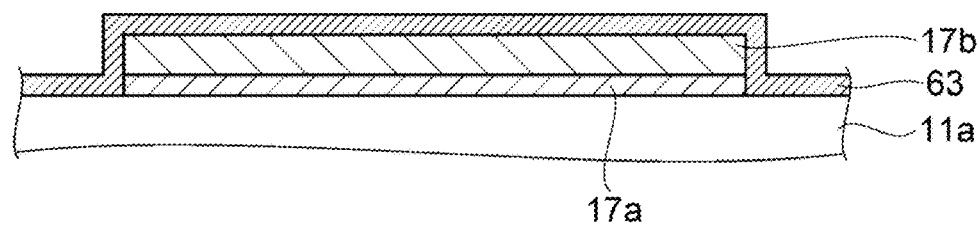
FIG. 12 is a schematic cross-sectional view illustrating each step in the method of forming a holding capacitor according to the first exemplary embodiment.

At step S3, as illustrated in FIG. 12, an amorphous silicon film 63 to be the third electrode layer 17c is formed to cover the first electrode layer 17a and the second electrode layer 17b stacked one on another. Examples of a method of forming the amorphous silicon film 63 include a sputtering method and a low-pressure CVD method. A film thickness of the amorphous silicon film 63 is, for example, 50 nm. Then, the process proceeds to step S4.

Figure 13:
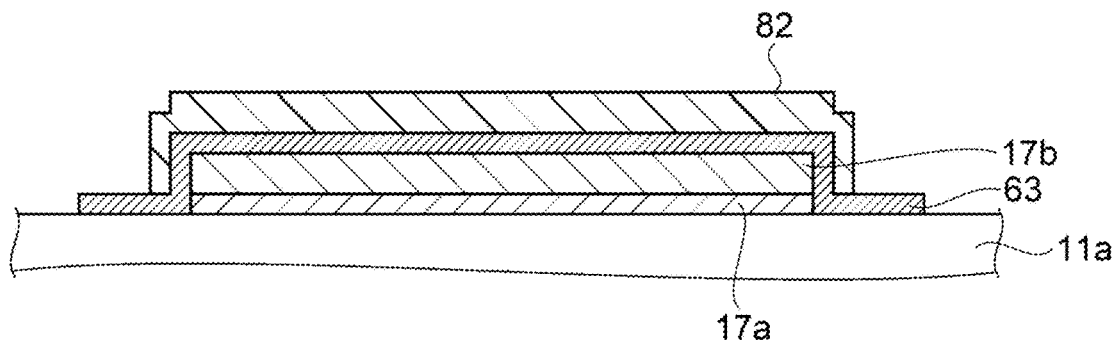
FIG. 13 is a schematic cross-sectional view illustrating each step in the method of forming a holding capacitor according to the first exemplary embodiment.
Figure 14:
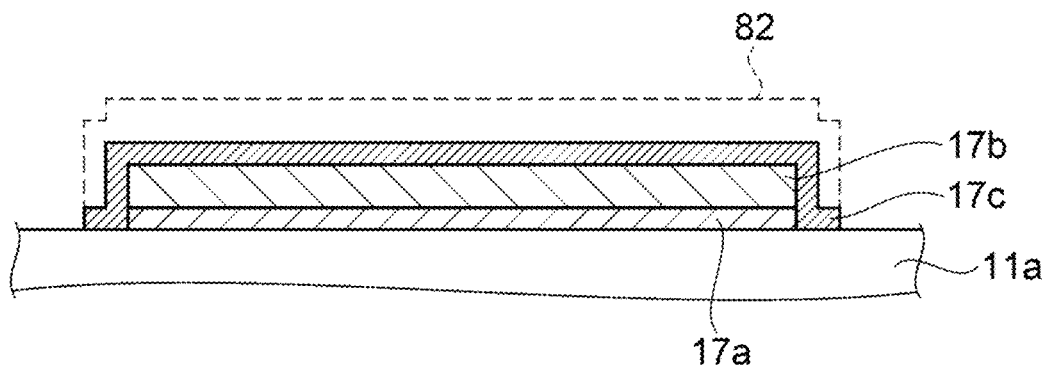
FIG. 14 is a schematic cross-sectional view illustrating each step in the method of forming a holding capacitor according to the first exemplary embodiment.

At step S4, as illustrated in FIG. 13, a resist pattern 82 is formed on the amorphous silicon film 63 by photolithography. Subsequently, the amorphous silicon film 63 is etched and patterned via the resist pattern 82 and thus, as illustrated in FIG. 14, the first electrode layer 17a containing tungsten silicide (WSix), the second electrode layer 17b containing titanium (Ti), and the third electrode layer 17c containing silicon are formed on the first interlayer insulation film 11a. Then, the process proceeds to step S5.

Figure 15:
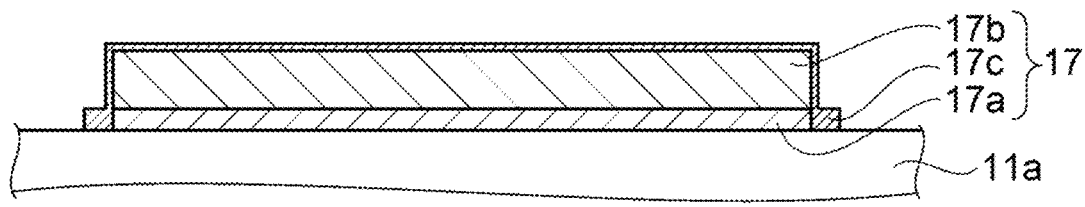
FIG. 15 is a schematic cross-sectional view illustrating each step in the method of forming a holding capacitor according to the first exemplary embodiment.

At step S5, a stacked body including the first electrode layer 17a, the second electrode layer 17b, and the third electrode layer 17c stacked one on another is subjected to a heat treatment at 600° C. or greater in an atmosphere containing an inert gas such as nitrogen. Examples of a method of the heat treatment include Rapid Thermal Processing (RTP) and annealing in a vertical furnace. Thus, silicon liberated from the first electrode layer 17a containing tungsten silicide and the third electrode layer 17c containing silicon reacts with the metal (Ti) in the second electrode layer 17b to form silicide (TiSix). Specifically, as illustrated in FIG. 15, silicidation of the second electrode layer 17b containing titanium (Ti) progresses and the film thickness of the second electrode layer 17b substantially increases, whereas the film thickness of the third electrode layer 17c containing silicon substantially decreases. The film thickness of the second electrode layer 17b at this stage becomes close to a value of from 100 nm to 150 nm obtained before the heat treatment is performed. Although a degree of the progress of the silicidation depends on a temperature and time of the heat treatment, the temperature and time of the heat treatment are set to enable the film thickness of the third electrode layer 17c containing silicon of at least approximately 5 nm to be ensured. Thus, in formation of the capacitance insulation film 16a to be subsequently formed, impurities such as metal elements incorporated in the second electrode layer 17b and the first electrode layer 17a as lower layers than the third electrode layer 17c are prevented from diffusing into the capacitance insulation film 16a. As for the temperature of the heat treatment at step S5, to make the first capacitance electrode 17 thermally stabilized even when a high temperature of 1000° C. is applied in subsequently performing formation of the semiconductor layer 30a of the TFT 30 or the like, the heat treatment at 1000° C. or greater is preferably performed at this stage to silicidize the second electrode layer 17b containing a metal (Ti). Then, the process proceeds to step S6.

Figure 16:
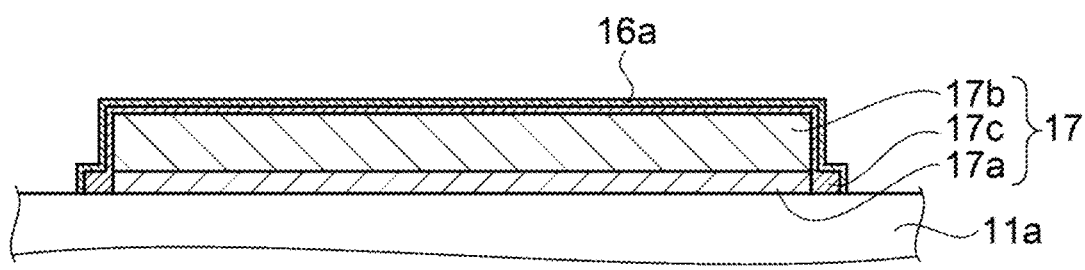
FIG. 16 is a schematic cross-sectional view illustrating each step in the method of forming a holding capacitor according to the first exemplary embodiment.

At step S6, as illustrated in FIG. 16, the capacitance insulation film 16a is formed to cover the surface including the side surfaces and the upper surface of the first capacitance electrode 17. As a method of forming the capacitance insulation film 16a, a silicon oxide film or a silicon nitride film difficult to cause the capacitance insulation film 16a to deteriorate in a high temperature treatment performed in forming the TFT 30 or the like is formed by a low-pressure CVD method. Specifically, in the case of forming the silicon oxide film (SiOx) by a low-pressure CVD method, for example, a reaction gas containing tetraethoxysilane (TEOS) is thermally decomposed at a temperature from 650° C. to 750° C. and under a pressure from 20 Pa to 200 Pa to form the film. In addition, in the case of forming the silicon nitride film (SixNy) by a low-pressure CVD method, for example, dichlorosilane ($SiH_2Cl_2$) is caused to react with ammonia ($NH_4$) at a temperature from 650° C. to 800° C. and under a pressure from 20 Pa to 200 Pa to form the film. Since a dielectric constant of the capacitance insulation film 16a influences electric capacitance, the film thickness of such a capacitance insulation film 16a is set to be in the range of from 5 nm to 20 nm. The capacitance insulation film 16a covers the surface of the first capacitance electrode 17 formed to be electrically independent in the pixel P and is similarly patterned in a cross shape in a plan view (see FIG. 6). Note that from the viewpoint of preventing oxidation due to heat of the first capacitance electrode 17 and the second capacitance electrode 18 subsequently formed, the capacitance insulation film 16a is preferably formed by using a silicon nitride film. Then, the process proceeds to step S7.

Figure 17:
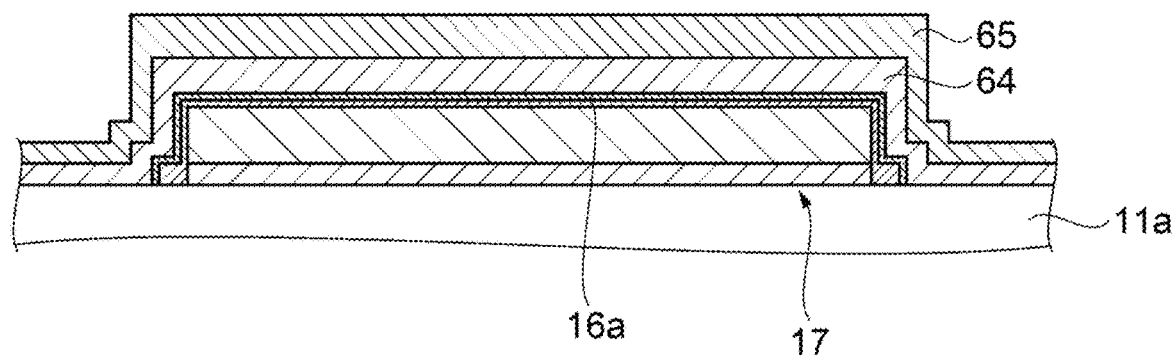
FIG. 17 is a schematic cross-sectional view illustrating each step in the method of forming a holding capacitor according to the first exemplary embodiment.

At step S7, as illustrated in FIG. 17, a tungsten silicide film 64 to be the fourth electrode layer 18a is formed to cover the capacitance insulation film 16a and subsequently a titanium film 65 as a metal film stacked on the tungsten silicide film 64 to be the fifth electrode layer 18b is formed. Examples of a method of forming these films include a sputtering method, a vapor deposition method, and a metal CVD method targeting materials of respective films. A film thickness of the tungsten silicide film 64 is, for example, 50 nm, and a film thickness of the titanium film 65 is, for example, 100 nm. Note that the metal film to be the fifth electrode layer 18b may be a hafnium film or a zirconium film. Then, the process proceeds to step S8.

Figure 18:
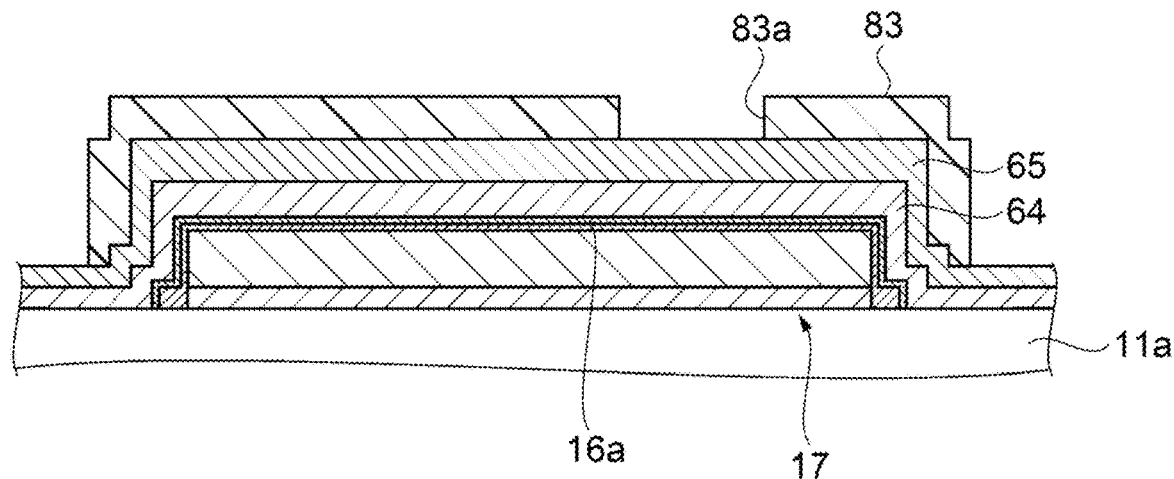
FIG. 18 is a schematic cross-sectional view illustrating each step in the method of forming a holding capacitor according to the first exemplary embodiment.
Figure 19:
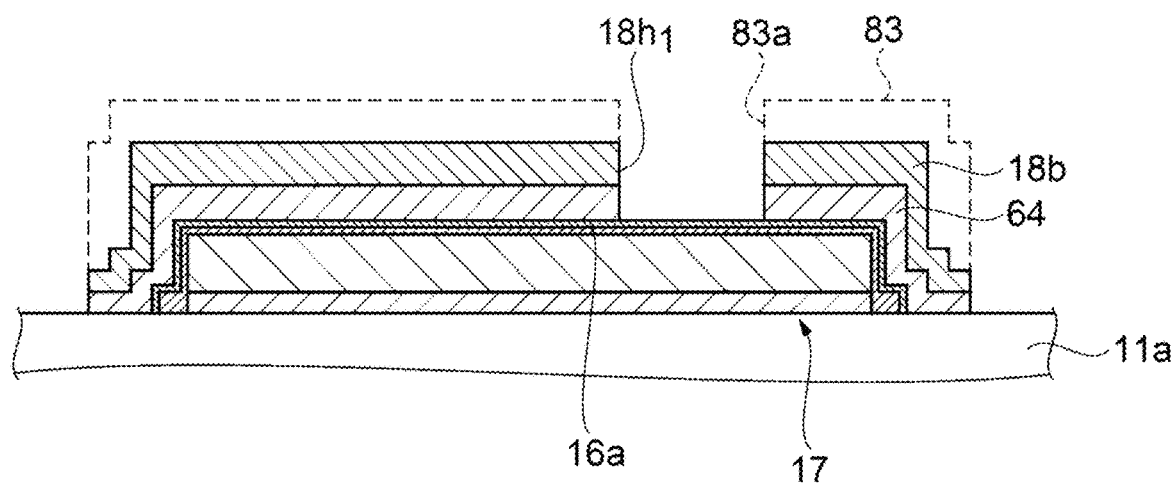
FIG. 19 is a schematic cross-sectional view illustrating each step in the method of forming a holding capacitor according to the first exemplary embodiment.

At step S8, as illustrated in FIG. 18, a resist pattern 83 is formed on the titanium film 65 by photolithography. In the resist pattern 83, an opening portion 83a is provided at a position corresponding to the contact hole 34 configured to couple the first capacitance electrode 17 to the TFT 30. Then, the titanium film 65 and the tungsten silicide film 64 are etched via the resist pattern 83. Thus, as illustrated in FIG. 19, the titanium film 65 is patterned to form the fifth electrode layer 18b and to form a through hole $18h_1$ penetrating the titanium film 65 and the tungsten silicide film 64 to reach the capacitance insulation film 16a. Then, the process proceeds to step S9.

Figure 20:
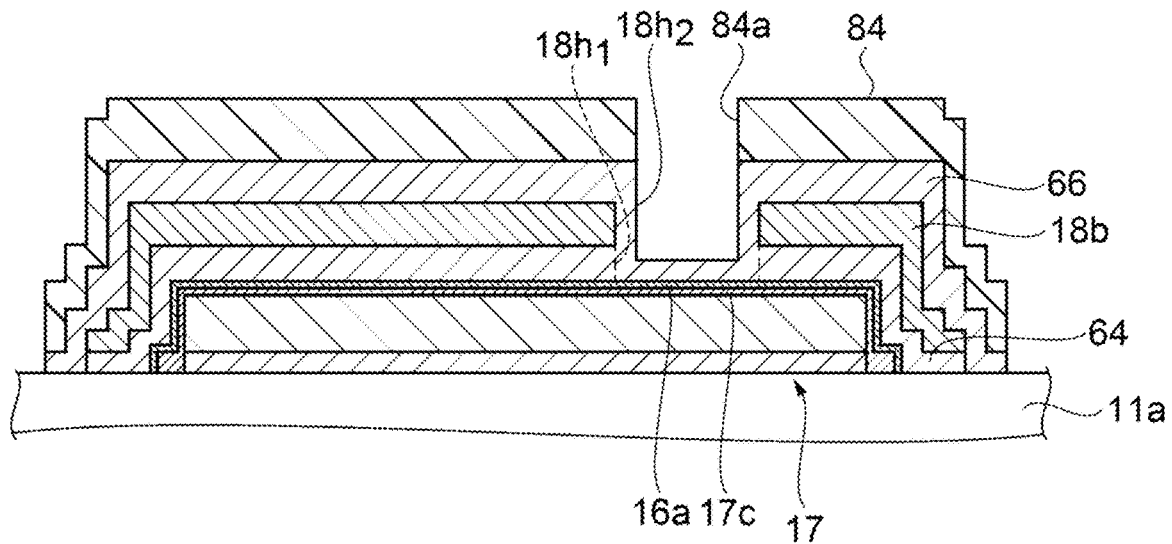
FIG. 20 is a schematic cross-sectional view illustrating each step in the method of forming a holding capacitor according to the first exemplary embodiment.

At step S9, as illustrated in FIG. 20, a tungsten silicide film 66 constituting the sixth electrode layer 18c is formed to cover the fifth electrode layer 18b or the tungsten silicide film 64 and to cover an inner side of the through hole $18h_1$. A film thickness of the tungsten silicide film 66 is, for example, 100 nm. In the tungsten silicide film 66, a hole (depression) $18h_2$ is newly formed in a portion corresponding to the through hole $18h_1$. Then, a resist pattern 84 is formed on the tungsten silicide film 66 by photolithography. In the resist pattern 84, an opening portion 84a is provided at a position corresponding to the hole $18h_2$. Then, the process proceeds to step S10.

Figure 21:
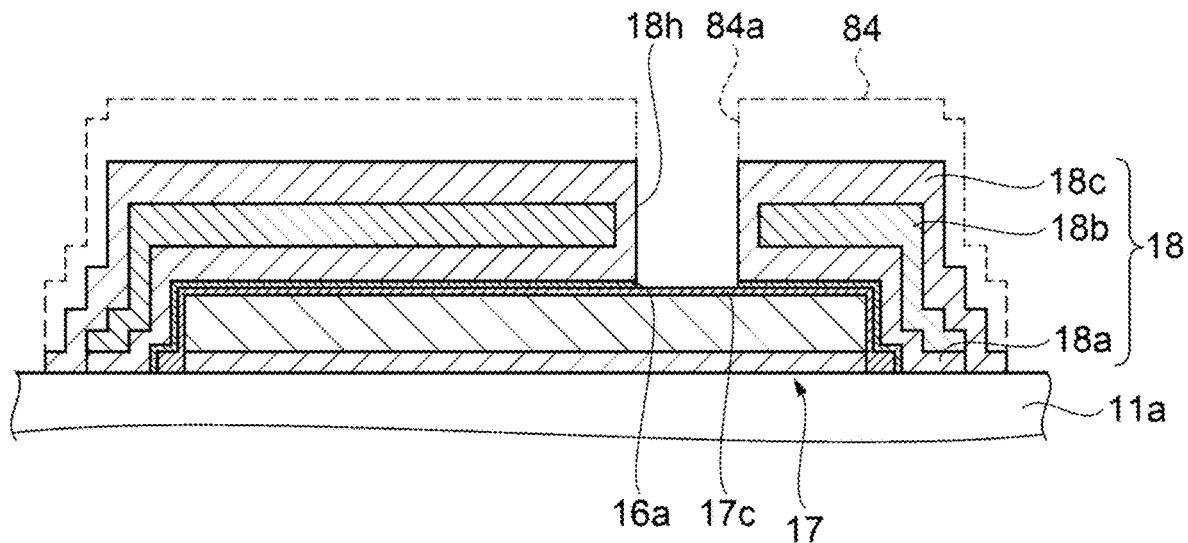
FIG. 21 is a schematic cross-sectional view illustrating each step in the method of forming a holding capacitor according to the first exemplary embodiment.

At step S10, as illustrated in FIG. 21, the tungsten silicide films 64 and 66 are etched via the resist pattern 84 to form the fourth electrode layer 18a and the sixth electrode layer 18c. The sixth electrode layer 18c (tungsten silicide film 66) located at a bottom portion of the opening portion 84a of the resist pattern 84 is etched and removed to form the opening portion 18h where the third electrode layer 17c of the first capacitance electrode 17 is exposed at a bottom portion. As illustrated in FIG. 7, the contact hole 34 is formed inside of the opening portion 18h to form the holding capacitor 16 including the drain region 30d of the semiconductor layer 30a of the TFT 30 electrically coupled to the first capacitance electrode 17 via the drain contact 32, the first relay layer 6b, and the contact hole 34. Note that the second capacitance electrode 18 including the fourth electrode layer 18a, the fifth electrode layer 18b, and the sixth electrode layer 18c stacked one on another may have an Optical Density (OD) value (−log T; transmittance) of approximately 1.0, and may include each of the electrode layers formed with silicide stabilized to the extent that disconnection does not occur even when a high temperature process in forming the TFT 30 is performed. In addition, since the second capacitance electrode 18 functions as the capacitance line 7 and a fixed potential is applied to the second capacitance electrode 18, the second capacitance electrode 18 may have relatively high resistance. In addition, the third electrode layer 17c is a thin film of silicon and thus, when the sixth electrode layer 18c (tungsten silicide film 66) located at the bottom portion of the opening portion 84a is etched and removed, the third electrode layer 17c may be removed partially or entirely.

According to the liquid crystal device 100 and the method of forming the holding capacitor 16 as the method of manufacturing the liquid crystal device 100 of the first exemplary embodiment, the following effects can be obtained.

(1) The element substrate 10 of the liquid crystal device 100 is provided with, for each pixel P, the TFT 30 as a transistor and the holding capacitor 16 configured to hold a potential applied to the pixel electrode 15 coupled to the TFT 30. The holding capacitor 16 includes the first capacitance electrode 17 and the second capacitance electrode 18 disposed to face each other via the capacitance insulation film 16a. The first capacitance electrode 17 includes the first electrode layer 17a containing tungsten silicide (WSix), the second electrode layer 17b containing silicide of a metal (Ti) more stabilized through silicidation than tungsten (W), and the third electrode layer 17c containing silicon stacked one on another in this order. The second electrode layer 17b is silicidized and formed by subjecting a metal (Ti) more stabilized through silicidation than tungsten (W) to a heat treatment at 600° C. or greater in an atmosphere containing an inert gas, and the second electrode layer 17b is thermally stabilized. Accordingly, even when a high temperature treatment at, for example, 600° C. or greater is performed in the step of forming the TFT 30, silicidation of the second electrode layer 17b proceeds and silicon is difficult to liberate. On the other hand, even when silicon is liberated owing to heat applied to the first electrode layer 17a containing tungsten silicide (WSix) and film quality changes to reduce a light shielding property, the second electrode layer 17b is thermally stabilized and thus, a reduction of the light shielding property of the first capacitance electrode 17 can be suppressed.

In addition, the scanning line 3 is provided between the base substrate 10s and the holding capacitor 16 of the element substrate 10. The scanning line 3 is disposed planarly corresponding to the intersection of the non-opening regions at which the TFT 30 is disposed. The scanning line 3 includes, for example, tungsten silicide (WSix). Accordingly, even when a high temperature treatment at, for example, 600° C. or greater is performed in the step of forming the TFT 30 or the like, and silicon is liberated owing to heat applied to the scanning line 3 containing tungsten silicide (WSix) and film quality changes to reduce a light shielding property, the holding capacitor 16 is formed in an upper layer of the scanning line 3 and thus, light incident on the TFT 30 from the base substrate 10s side can be blocked. Namely, as compared to the case of forming the holding capacitor 16 in an upper layer of the TFT 30 on the base substrate 10s, even when light is incident from the base substrate 10s side toward the TFT 30, the incident light can be blocked by the scanning line 3 and the first capacitance electrode 17, and also the liquid crystal device 100 as an electro-optical device including the holding capacitor 16 having desired electric capacitance can be provided. Note that also in the case where the scanning line 3 includes a metal or an alloy, even when a high temperature treatment at, for example, 600° C. or greater is performed and the scanning line 3 oxidizes to reduce a light shielding property, a similar effect can be obtained.

(2) The second capacitance electrode 18 of the holding capacitor 16 includes the fourth electrode layer 18a containing tungsten silicide (WSix), the fifth electrode layer 18b stacked on the fourth electrode layer 18a and containing a metal (Ti) more stabilized through silicidation than tungsten (W), and the sixth electrode layer 18c stacked on the fifth electrode layer and containing tungsten silicide (WSix). The fifth electrode layer 18b is formed by subjecting a metal (Ti) more stabilized through silicidation than tungsten to a heat treatment at, for example, 600° C. or greater in the step of forming the TFT 30 or the like, and by causing silicon liberated from tungsten silicide owing to heat applied to the fourth electrode layer 18a or the sixth electrode layer 18c to react with the metal (Ti) in the fifth electrode layer 18b to form silicide (TiSix). Accordingly, even when film quality of the fourth electrode layer 18a or the sixth electrode layer 18c changes owing to the above-described high temperature treatment to reduce a light shielding property, the fifth electrode layer 18b is silicidized and thus, a reduction of the light shielding property of the second capacitance electrode 18 can be suppressed. That is, light incident from the base substrate 10s side toward the TFT 30 can be blocked by the first capacitance electrode 17 of the holding capacitor 16 and also by the second capacitance electrode 18.

(3) The method of forming the holding capacitor 16 includes the step of, after the forming the third electrode layer, performing a heat treatment at 600° C. or greater in an atmosphere containing an inert gas. Thus, silicon liberated from the third electrode layer 17c mainly containing silicon bonds to the metal (Ti) incorporated in the second electrode layer 17b to undergo silicidation. Thus, since the third electrode layer 17c contains silicon, in forming the capacitance insulation film 16a including, for example, a silicon oxide film or a silicon nitride film on the first capacitance electrode 17, namely, on the third electrode layer 17c, the third electrode layer 17c becomes less susceptible to influence of impurities such as metal elements incorporated in the first electrode layer 17a or the second electrode layer 17b, and a high insulating property can be ensured in the capacitance insulation film 16a. In addition, a film forming apparatus used in forming the capacitance insulation film 16a also becomes less susceptible to contamination by the above-described metal elements. Namely, the method of manufacturing an electro-optical device capable of blocking incident light by the first capacitance electrode 17 constituting the holding capacitor 16 even when the light is incident from the base substrate 10s side toward the TFT 30, and including the holding capacitor 16 having desired electric capacitance can be provided.

(4) According to the method of forming the holding capacitor 16, after the third electrode layer 17c containing silicon is formed, a heat treatment at 600° C. or greater is performed in an atmosphere containing an inert gas to silicidize the metal (Ti) in the second electrode layer 17b, and then the film thickness of the second electrode layer 17b substantially increases while the film thickness of the third electrode layer 17c substantially decreases. Although the second electrode layer 17b containing a metal (Ti) is silicidized, the film thickness of the second electrode layer 17b becomes greater than the film thickness of the first electrode layer 17a or the third electrode layer 17c and thus, the light shielding property of the first capacitance electrode 17 can be ensured.

(5) In the holding capacitor 16, the second capacitance electrode 18 disposed to face via the capacitance insulation film 16a the first capacitance electrode 17 independently formed for each pixel P is formed in a lattice pattern corresponding to the non-opening regions to function as the capacitance line 7 extending across the plurality of pixels P. Since the second capacitance electrode 18 of a triple-layer structure having a light shielding property ensured even when the second capacitance electrode 18 is subjected to a heat treatment is disposed on the side closer to the TFT 30 than the first capacitance electrode 17, light incident on the TFT 30 from the base substrate 10s side can be blocked effectively.

(6) The contact hole 34 configured to couple the first capacitance electrode 17 to the TFT 30 is formed inside of the opening portion 18h of the second capacitance electrode 18. In the step of forming the sixth electrode layer 18c constituting the second capacitance electrode 18, the sixth electrode layer 18c (tungsten silicide film 66) is formed on the inner wall of the opening portion 18h to cover the inner side of the through hole $18h_1$ to be the opening portion 18h, and to prevent the fifth electrode layer 18b from being exposed. Accordingly, even when a heat treatment at, for example, 600° C. or greater is performed in the step of forming the TFT 30 or the like, oxidation of the fifth electrode layer 18b containing a metal (Ti) from the opening portion 18h side and a reduction of a light shielding property can be prevented.

Second Exemplary Embodiment

Electro-Optical Device

Next, an electro-optical device of the second exemplary embodiment will be described by exemplifying a liquid crystal device as with the first exemplary embodiment. The liquid crystal device as the electro-optical device of the second exemplary embodiment includes a liquid crystal layer interposed between an element substrate and a counter substrate, and is different from the first exemplary embodiment in disposition of a scanning line and a holding capacitor between a base substrate 10s and a TFT 30 in the element substrate and a configuration related to each of the scanning line and the holding capacitor. Accordingly, the same configurations as the configurations in the liquid crystal device 100 of the first exemplary embodiment are denoted by the same reference signs, and detailed description of the same configurations will be omitted.

Figure 22:
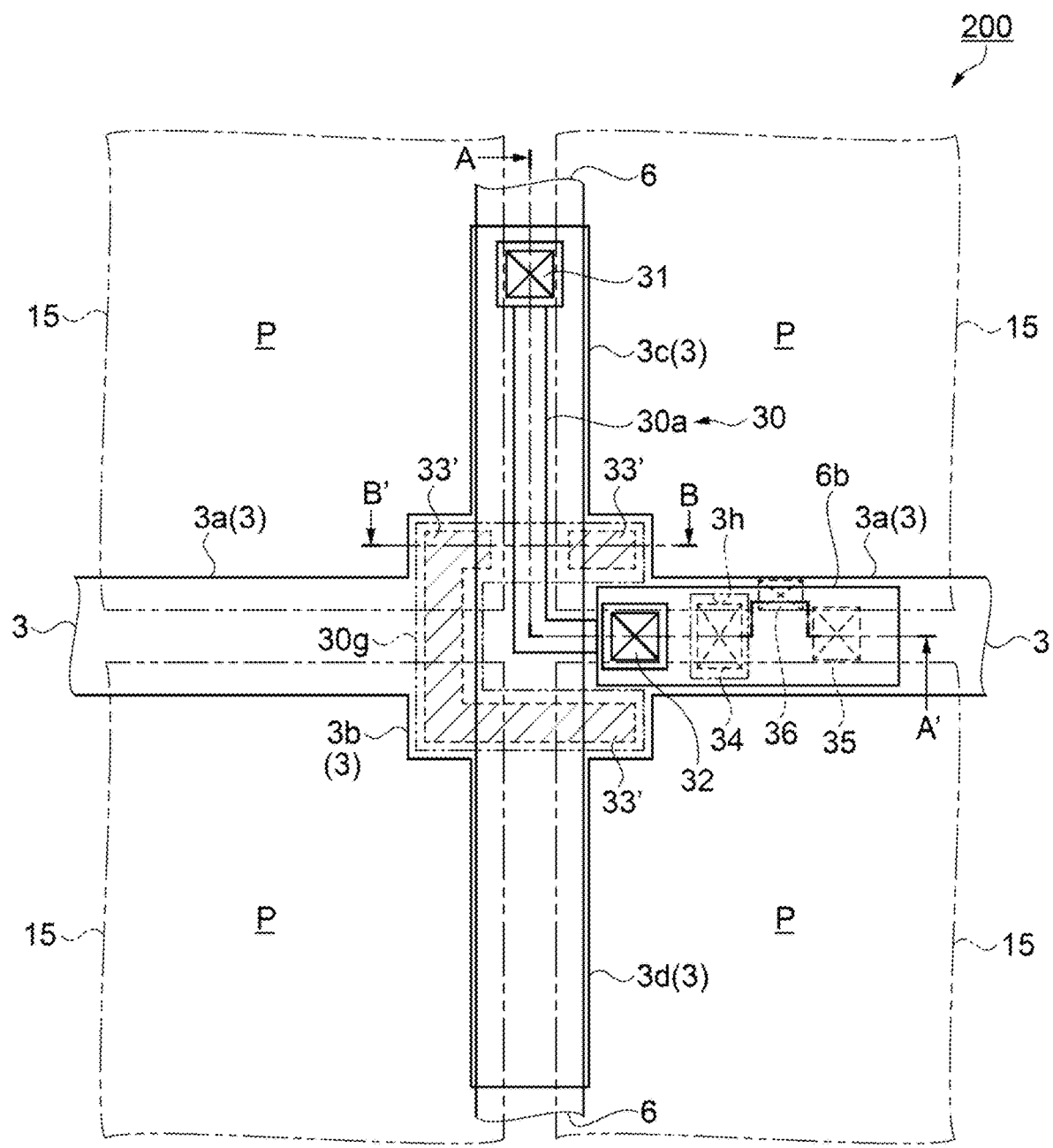
FIG. 22 is a schematic plan view illustrating disposition of a TFT, wiring, and the like at an intersection of non-opening regions of a liquid crystal device of a second exemplary embodiment.
Figure 23:
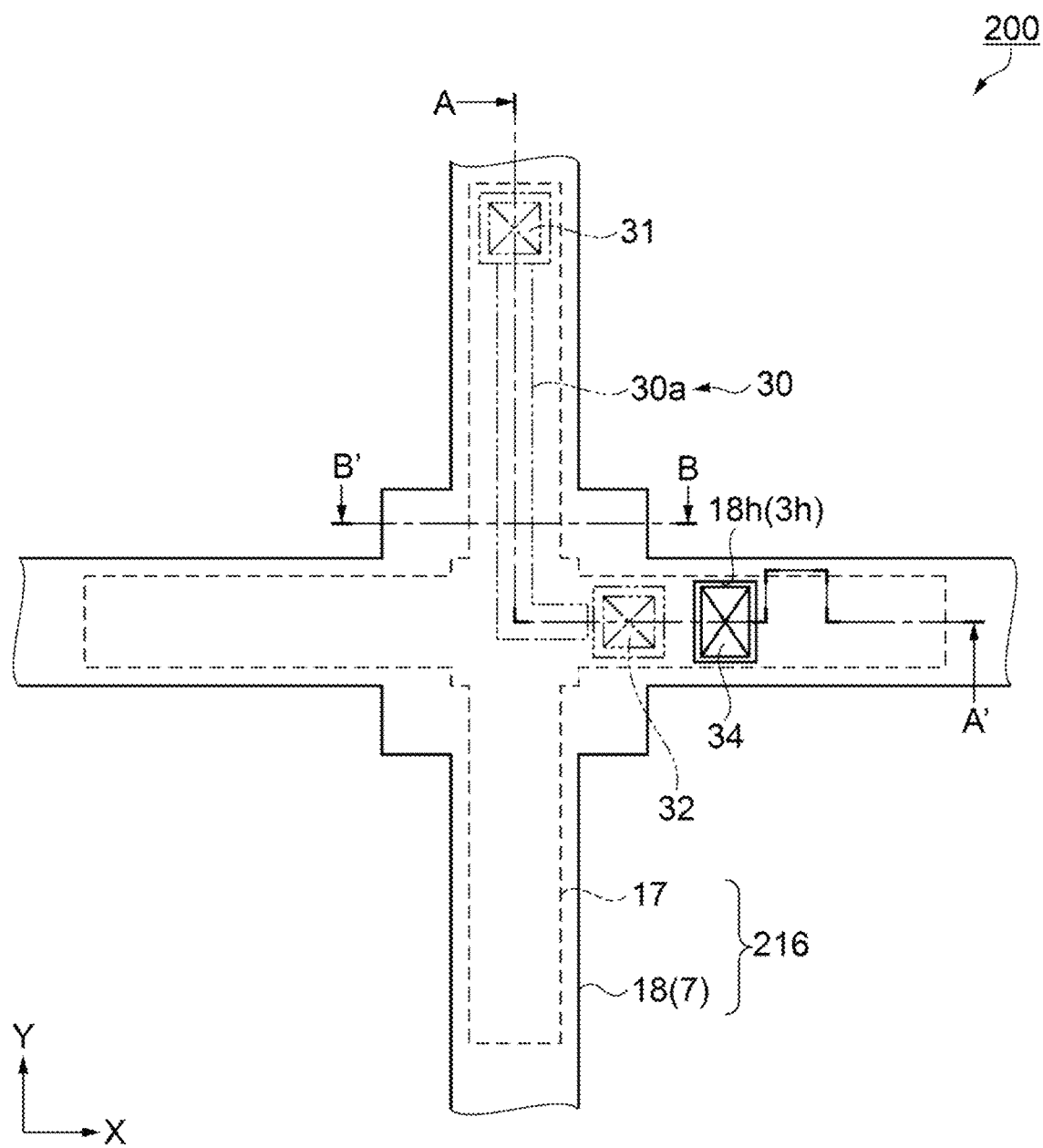
FIG. 23 is a schematic plan view illustrating disposition of a capacitance electrode at the intersection of the non-opening regions of the liquid crystal device of the second exemplary embodiment.

FIG. 22 is a schematic plan view illustrating disposition of the TFT, wiring, and the like at an intersection of non-opening regions of the liquid crystal device of the second exemplary embodiment, and FIG. 23 is a schematic plan view illustrating disposition of a capacitance electrode at the intersection of the non-opening regions of the liquid crystal device of the second exemplary embodiment.

As illustrated in FIG. 22, in a liquid crystal device 200 of the second exemplary embodiment, the TFT 30 is disposed at the intersection of the non-opening regions surrounding an opening region of a pixel P in which a pixel electrode 15 is disposed. A scanning line 3 electrically coupled to the TFT 30 is configured to include a main line portion 3a extending in the X direction across a plurality of the pixels P, an extended portion 3b having widths in the X direction and in the Y direction extended greater than widths of the main line portion 3a, corresponding to the intersection of the non-opening regions, a protruding portion 3c protruding upward in the Y direction from the extended portion 3b in the drawing, and a protruding portion 3d protruding downward in the Y direction from the extended portion 3b similarly in the drawing.

A semiconductor layer 30a of the TFT 30 bends at the intersection of the non-opening regions, namely, at the center of the extended portion 3b of the scanning line 3, and includes a portion extending in the X direction and a portion extending in the Y direction. The portion extending in the X direction of the semiconductor layer 30a planarly overlaps with the main line portion 3a of the scanning line 3, and a drain contact 32 is provided on the leading end side of the portion extending in the X direction. The portion extending in the Y direction of the semiconductor layer 30a planarly overlaps with a protruding portion 3c of the scanning line 3, and a source contact 31 is provided on the leading end side of the portion extending in the Y direction.

A data line 6 electrically coupled to the TFT 30 planarly overlaps with the intersection of the non-opening regions and extending in the Y direction across the plurality of pixels P. The data line 6 is coupled to the semiconductor layer 30a of the TFT 30 via the source contact 31.

As described in detail below, the semiconductor layer 30a and a gate electrode 30g are provided between the scanning line 3 and the data line 6 on the base substrate 10s. The gate electrode 30g is disposed to planarly overlap with the intersection of the non-opening regions. Specifically, the gate electrode 30g has a bent shape including a portion extending in the Y direction in parallel with the semiconductor layer 30a in a plan view and portions extending in the X direction respectively from both ends of the portion extending in the Y direction. A portion extending in the X direction located upward in the Y direction in the drawing of a pair of the portions extending in the X direction of the gate electrode 30g planarly overlaps with a channel region of the semiconductor layer 30a.

A gate contact 33' in the second exemplary embodiment configured to electrically couple the scanning line 3 to the gate electrode 30g planarly overlaps with the gate electrode 30g bent, and includes a first portion formed in a substantially L-shape in a plan view corresponding to the extended portion 3b of the scanning line 3 and a second portion disposed in an island shape at a position spaced apart from the first portion with the semiconductor layer 30a interposed between the first portion and the second portion. In other words, the gate contact 33' is provided along the channel region and a drain region of the semiconductor layer 30a bent at the intersection of the non-opening regions.

In addition, on the base substrate 10s, a first relay layer 6b is provided in a wiring layer in which the data line 6 is provided. The first relay layer 6b has an island shape electrically independent. The first relay layer 6b is disposed extending in the X direction to planarly overlap with a drain contact 32 of the TFT 30 at a position spaced apart from the data line 6 in the X direction. The first relay layer 6b is disposed to planarly overlap with a contact hole 34 related to coupling with a holding capacitor 216 (see FIG. 23) of the second exemplary embodiment and two contact holes 35 and 36 related to coupling with the pixel electrode 15.

In addition, the contact hole 34 configured to electrically coupling the holding capacitor 216 to the TFT 30 is provided, in a plan view, inside of an opening portion 3h provided in the scanning line 3. Thus, the disposition related to the gate contact 33' and the holding capacitor 216 is a difference from the disposition related to the holding capacitor 16 in the first exemplary embodiment.

The contact hole 36 is located in the non-opening region surrounding the opening region, and is located at a position where the contact hole 36 planarly overlaps with an outer edge of the pixel electrode 15 disposed to cover the non-opening region. As described in detail below, the pixel electrode 15 is coupled to the semiconductor layer 30a of the TFT 30 via the contact hole 36, the contact hole 35, the first relay layer 6b, and the drain contact 32. That is, the TFT 30 related to the pixel P on the upper right in the drawing is disposed at the intersection of the non-opening regions. Disposition of the TFT 30 in each of the other pixels P is also similar.

Note that, as described in the first exemplary embodiment, the disposition of the TFT 30 in the pixel P is not limited to the disposition described above, and disposition where the semiconductor layer 30a is not bent and the TFT 30 extends in the X direction along the main line portion 3a of the scanning line 3, or disposition where the TFT 30 extends in the Y direction along the data line 6 can also be employed.

As illustrated in FIG. 23, the holding capacitor 216 of the second exemplary embodiment includes a first capacitance electrode 17 and a second capacitance electrode 18 disposed to face each other via a capacitance insulation film. In addition, the first capacitance electrode 17 of the holding capacitor 216 is provided independently for each pixel P corresponding to the intersection of the non-opening regions. The first capacitance electrode 17 includes portions extending to both sides in the X direction (the right side and the left side in the drawing) and portions extending to both sides in the Y direction (the upper side and the lower side in the drawing), and has a cross-shaped outline.

A portion extending to the right side in the X direction of the first capacitance electrode 17 planarly overlaps with the drain contact 32 of the TFT 30 and planarly overlaps with the contact hole 34 related to coupling with the TFT 30. In addition, a portion extending to the upper side in the Y direction of the first capacitance electrode 17 extends to a position where the portion planarly overlaps with the source contact 31 of the TFT 30.

Such a second capacitance electrode 18 disposed to face the first capacitance electrode 17 via the capacitance insulation film is provided corresponding to the intersection of the non-opening regions, and has widths in the X direction and in the Y direction greater (wider) than widths of the first capacitance electrode 17. In addition, the second capacitance electrode 18 extends in the X direction and in the Y direction across the plurality of pixels P and is formed in a lattice pattern at least in a display region E as with the non-opening regions illustrated in FIG. 4 and electrically functions as the capacitance line 7 illustrated in FIG. 3.

In the portion extending to the right side in the X direction from the intersection of the second capacitance electrodes 18, an opening portion 18h (opening portion 3h) is provided at a position where the portion planarly overlaps with the contact hole 34 configured to couple the first capacitance electrode 17 to the TFT 30.

Structure of Element Substrate

Figure 24:
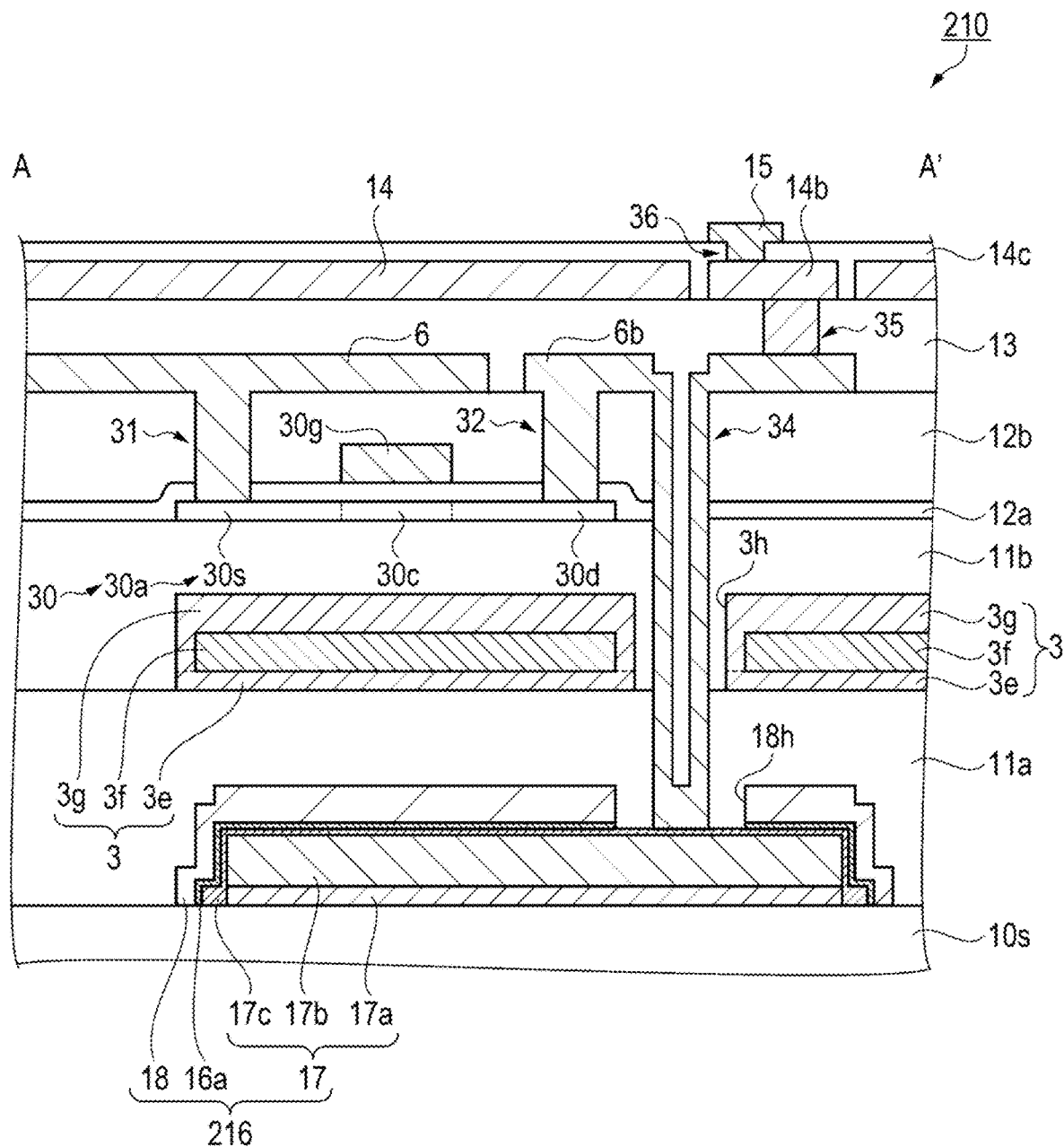
FIG. 24 is a schematic cross-sectional view illustrating a structure of an element substrate taken along line A-A' of FIGS. 22 and 23.
Figure 25:
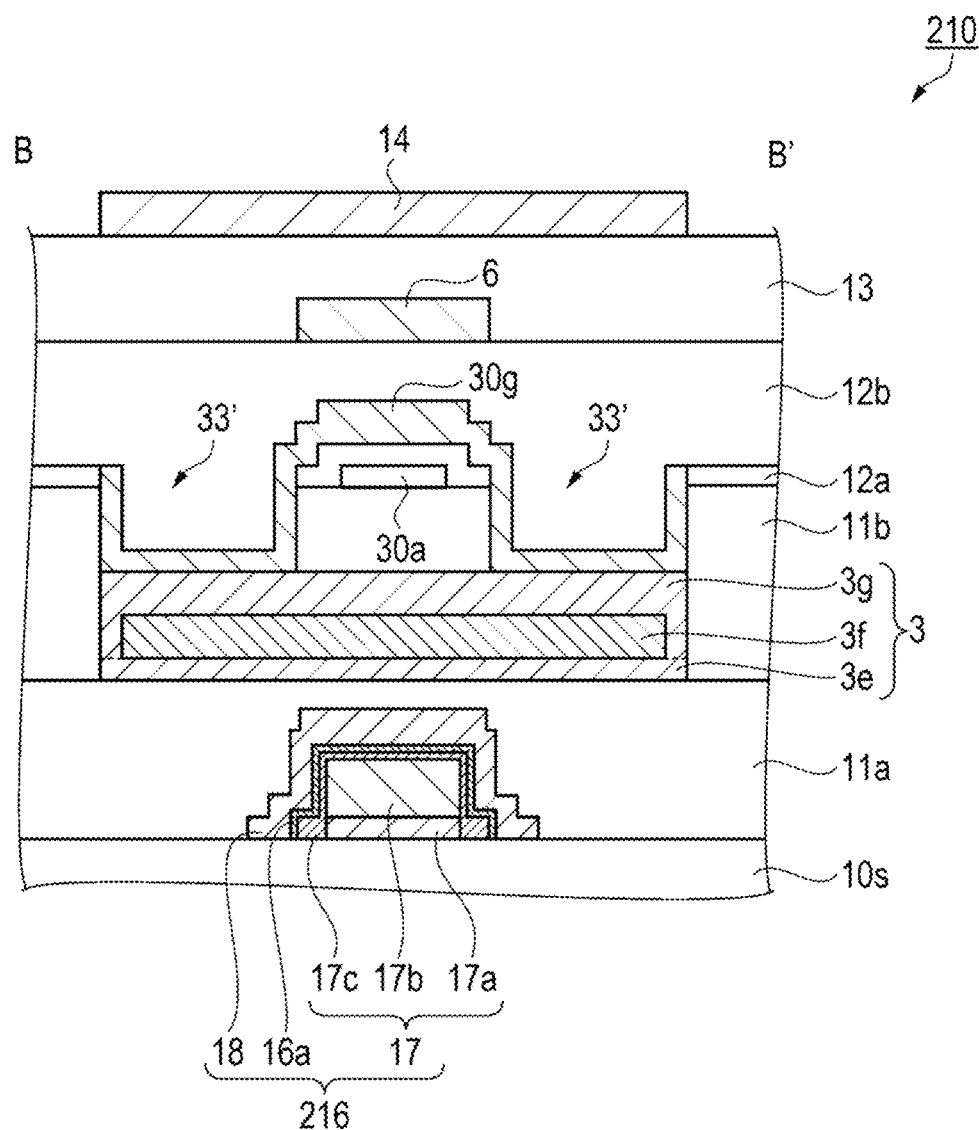
FIG. 25 is a schematic cross-sectional view illustrating a structure of the element substrate taken along line B-B' of FIGS. 22 and 23.

Next, a structure of the element substrate in the liquid crystal device 200 of the second exemplary embodiment will be described with reference to FIGS. 24 and 25. FIG. 24 is a schematic cross-sectional view illustrating a structure of the element substrate taken along line A-A' of FIGS. 22 and 23, and FIG. 25 is a schematic cross-sectional view illustrating a structure of the element substrate taken along line B-B' of FIGS. 22 and 23. Line A-A' is a line segment traversing the semiconductor layer 30a and the contact holes 34, 36, and 35. Line B-B' is a line segment traversing, in the X direction, the first portion having an L-shape of the gate contact 33' and the second portion having an island-shape of the gate contact 33'.

As illustrated in FIG. 24, in an element substrate 210 of the liquid crystal device 200 of the second exemplary embodiment, the holding capacitor 216 is firstly formed on the base substrate 10s. The holding capacitor 216 is configured to include the first capacitance electrode 17, a capacitance insulation film 16a formed to cover the first capacitance electrode 17, and the second capacitance electrode 18 disposed to face the first capacitance electrode 17 via the capacitance insulation film 16a.

The first capacitance electrode 17 includes a first electrode layer 17a, a second electrode layer 17b, and a third electrode layer 17c stacked one on another in this order. The first electrode layer 17a contains tungsten silicide (WSix), and a film thickness of the first electrode layer 17a is, for example, 50 nm. The second electrode layer 17b contains silicide of titanium (Ti) as a metal more stabilized through silicidation than tungsten (W), and a film thickness of the second electrode layer 17b is, for example, 150 nm. The third electrode layer 17c contains silicon, and a film thickness of the third electrode layer 17c is, for example, approximately 5 nm. Note that, as described in the first exemplary embodiment, examples of the metal more stabilized through silicidation than tungsten include hafnium (Hf) and zirconium (Zr) in addition to titanium (Ti). In addition, a surface including side surfaces and an upper surface of the first electrode layer 17a and the second electrode layer 17b stacked one on another is covered with the third electrode layer 17c.

The capacitance insulation film 16a can be formed by using a silicon oxide film or a silicon nitride film. In addition, the capacitance insulation film 16a may be formed by using a dielectric film having a high dielectric constant such as an aluminum oxide film, a titanium oxide film, a tantalum oxide film, a niobium oxide film, a hafnium oxide film, a lanthanum oxide film, and a zirconium oxide film. Further, some dielectric films selected from these dielectric films may be stacked one on another to form the capacitance insulation film 16a. Particularly, a silicon oxide film or a silicon nitride film difficult to thermally change even when the film is subjected to a heat treatment at, for example, 600° C. or greater is preferably used, and in consideration of oxidation due to heat of the first capacitance electrode 17 and the second capacitance electrode 18 being in contact with the capacitance insulation film 16a, the silicon nitride film is more preferable. In the case of using these silicon compound films as the capacitance insulation film 16a, a film thickness of the capacitance insulation film 16a ranges, for example, approximately from 5 nm to 20 nm, in consideration of electric capacitance of the holding capacitor 216.

The second capacitance electrode 18 of the second exemplary embodiment includes a single layer structure formed, for example, by using a single metal, an alloy, metal silicide, or polysilicide including at least one of high melting point metals such as Ti, Cr, Mo, Ta, and W, or non-crystalline silicon, polysilicon, or the like. In the second capacitance electrode 18, the opening portion 18h provided with the contact hole 34 configured to electrically coupling the first capacitance electrode 17 to the TFT 30 is formed. In the second exemplary embodiment, the second capacitance electrode 18 contains tungsten silicide, and a film thickness of the second capacitance electrode 18 ranges, for example, from 200 nm to 500 nm.

Next, a first interlayer insulation film 11a covering the holding capacitor 216 is formed. As described in the first exemplary embodiment, the first interlayer insulation film 11a is formed by using an NSG film or a silicon nitride film in which no impurities are intentionally introduced. The first interlayer insulation film 11a is subjected to planarization processing for mitigating irregularities caused by covering the holding capacitor 216. A film thickness of the first interlayer insulation film 11a obtained after the planarization processing ranges, for example, from 200 nm to 500 nm.

Next, the scanning line 3 is formed on the first interlayer insulation film 11a. The scanning line 3 of the second exemplary embodiment includes a first wiring layer 3e containing tungsten silicide (WSix), a second wiring layer 3f containing silicide of a metal more stabilized through silicidation than tungsten, a third wiring layer 3g containing tungsten silicide (WSix) sequentially stacked one on another. A film thickness of the first wiring layer 3e is, for example, 50 nm, a film thickness of the second wiring layer 3f is, for example, 100 nm, and a film thickness of the third wiring layer 3g is, for example, 100 nm. The opening portion 3h provided with the contact hole 34 configured to electrically coupling the first capacitance electrode 17 to the TFT 30 is also formed in the scanning line 3. A surface of the second wiring layer 3f including an inner wall of the opening portion 3h is covered with the third wiring layer 3g containing tungsten silicide (WSix). Note that the metal more stabilized through silicidation than tungsten (W) is selected from titanium (Ti), hafnium (Hf), and zirconium (Zr), and in the second exemplary embodiment, the second wiring layer 3f is formed by silicidizing titanium (Ti) as a metal by a high temperature treatment related to formation of the TFT 30.

Next, the second interlayer insulation film 11b covering the scanning line 3 is formed. The second interlayer insulation film 11b is also formed by using an NSG film or a silicon nitride film in which no impurities are intentionally introduced. A film thickness of the second interlayer insulation film 11b ranges, for example, from 200 nm to 500 nm.

Next, the semiconductor layer 30a of the TFT 30 is formed on the second interlayer insulation film 11b. A wiring structure in each of upper layers of the semiconductor layer 30a is basically the same as in the first exemplary embodiment described above. As described in the first exemplary embodiment, the semiconductor layer 30a is formed by selectively implanting impurity ions into the polysilicon film to constitute a Lightly-Doped Drain (LDD) structure including a source region 30s, a channel region 30c, and a drain region 30d. A film thickness of the semiconductor layer 30a ranges, for example, from 30 nm to 70 nm.

Next, a gate insulating film 12a covering the semiconductor layer 30a is formed. The gate insulating film 12a includes a double-layer structure including, for example, a first silicon oxide film obtained by thermally oxidizing a semiconductor film of silicon and a second silicon oxide film formed under a high-temperature condition of from 700° C. to 900° C. by using a low-pressure CVD method. A film thickness of the gate insulating film 12a ranges, for example, approximately from 50 nm to 100 nm.

Next, the gate electrode 30g is formed on the gate insulating film 12a. As described in the first exemplary embodiment, the gate electrode 30g is formed by using a conductive polysilicon film, a metal silicide film, a metal film, a metal compound film, or the like. The gate electrode 30g is patterned to overlap in a plan view with the channel region 30c of the semiconductor layer 30a.

Note that, prior to the formation of the gate electrode 30g on the gate insulating film 12a, a groove penetrating the gate insulating film 12a and the second interlayer insulation film 11b to reach the scanning line 3 as illustrated in FIG. 25 is formed by, for example, dry etching. The gate electrode 30g and the gate contact 33' are formed by forming and patterning the metal compound film described above to cover an inner side of the groove. As illustrated in FIG. 22, the gate contact 33' is formed to include the first portion having an L-shape planarly corresponding to the extended portion 3b of the scanning line 3 and the second portion having an island-shape, and the scanning line 3 is electrically coupled to the gate electrode 30g via such a gate contact 33'.

Again with reference to FIG. 24, a third interlayer insulation film 12b is formed to cover the gate electrode 30g. As described in the first exemplary embodiment, the third interlayer insulation film 12b is formed by using a silicon oxide film such as an NSG film, a PSG film containing phosphorus (P), a BSG film containing boron, and a BPSG film containing boron (B) and phosphorus (P). A film thickness of the third interlayer insulation film 12b ranges, for example, from 200 nm to 500 nm. Note that the third interlayer insulation film 12b may be subjected to planarization processing.

Next, a through hole penetrating the third interlayer insulation film 12b and the gate insulating film 12a to reach each of the source region 30s and the drain region 30d of the semiconductor layer 30a is formed by, for example, dry etching. In addition, a through hole penetrating the third interlayer insulation film 12b, the gate insulating film 12a, and the second interlayer insulation film 11b, passing through the opening portion 3h of the scanning line 3, further penetrating the first interlayer insulation film 11a, and passing through the opening portion 18h of the second capacitance electrode 18 to reach the first capacitance electrode 17 of the holding capacitor 216 is formed by, for example, dry etching. Since the latter through hole has a depth greater than a depth of the former through hole, the former through hole and the latter through hole are formed separately. Then, a low resistance conductive film is formed and patterned to cover inner sides of these through holes and to cover a surface of the third interlayer insulation film 12b, and thus the source contact 31, the data line 6, the drain contact 32, the first relay layer 6b, and the contact hole 34 are formed. The source region 30s of the semiconductor layer 30a is electrically coupled to the data line 6 by the source contact 31. The drain region 30d of the semiconductor layer 30a is electrically coupled to the first relay layer 6b by the drain contact 32, and further, the first capacitance electrode 17 is electrically coupled to the drain region 30d of the semiconductor layer 30a via the contact hole 34 coupled to the first relay layer 6b.

Examples of the low resistance conductive film constituting the data line 6 or the first relay layer 6b can include an aluminum alloy film, and a stacked film of an aluminum film and a titanium nitride film.

Next, a fourth interlayer insulation film 13 is formed to cover the data line 6 and the first relay layer 6b. As with the third interlayer insulation film 12b, the fourth interlayer insulation film 13 is also formed by using a silicon-based oxide film such as an NSG film, a PSG film, a BSG film, and a BPSG film.

Next, a through hole penetrating the fourth interlayer insulation film 13 to reach the first relay layer 6b is formed by, for example, dry etching, and a low resistance conductive film embedded in the through hole and also covering a surface of the fourth interlayer insulation film 13 is formed. This low resistance conductive film can also be formed, for example, by using an aluminum alloy film, a stacked film of an aluminum film and a titanium nitride film, or the like. The conductive film is patterned to form a shield layer 14, a second relay layer 14b, and the contact hole 35. The first relay layer 6b is electrically coupled to the second relay layer 14b by the contact hole 35.

Next, a fifth interlayer insulation film 14c is formed to cover the shield layer 14 and the second relay layer 14b. As with the third interlayer insulation film 12b, the fifth interlayer insulation film 14c is also formed by using a silicon-based oxide film such as an NSG film, a PSG film, a BSG film, and a BPSG film. In the fifth interlayer insulation film 14c, a through hole reaching the second relay layer 14b is formed by, for example, dry etching. A transparent conductive film such as an ITO film is formed on the fifth interlayer insulation film 14c and covers the inner side of the through hole. Then, the transparent conductive film is patterned to form the pixel electrode 15 and the contact hole 36. The pixel electrode 15 is coupled to the second relay layer 14b via the contact hole 36. That is, the pixel electrode 15 is electrically coupled to the drain region 30d of the semiconductor layer 30a via the contact hole 36, the second relay layer 14b, the contact hole 35, the first relay layer 6b, and the drain contact 32.

Method of Manufacturing Electro-Optical Device

A method of manufacturing the liquid crystal device 200 as a method of manufacturing an electro-optical device according to the second exemplary embodiment has a feature in a method of forming the holding capacitor 216 and a method of forming the scanning line 3. Methods of forming other configurations in the element substrate 210 are basically the same as in the element substrate 10 of the first exemplary embodiment.

The method of forming the holding capacitor 216 in the second exemplary embodiment includes a step of forming the first electrode layer 17a containing tungsten silicide (WSix), a step of forming the second electrode layer 17b stacked on the first electrode layer 17a and containing a metal more stabilized through silicidation than tungsten (W), a step of forming the third electrode layer 17c stacked on the second electrode layer 17b and containing silicon, and a step of, after the forming the third electrode layer 17c, performing a heat treatment at 600° C. or greater in an atmosphere containing an inert gas to silicidize the second electrode layer 17b. In addition, the method further includes a step of forming the capacitance insulation film 16a covering the third electrode layer 17c and a step of forming the second capacitance electrode 18 to face the first capacitance electrode 17 via the capacitance insulation film 16a. Note that the metal incorporated in the second electrode layer 17b and more stabilized through silicidation than tungsten (W) is not limited to titanium (Ti), and hafnium (Hf) or zirconium (Zr) may be used. In addition, the third electrode layer 17c is formed by forming and patterning amorphous silicon.

A heat treatment at 600° C. or greater in an atmosphere containing an inert gas is performed and thus, silicon is liberated from the first electrode layer 17a containing tungsten silicide and the third electrode layer 17*c* containing silicon and reacts with titanium (Ti) in the second electrode layer 17*b* to form titanium silicide (TiSix). That is, the second electrode layer 17*b* is silicidized and the film thickness of the second electrode layer 17*b* substantially increases, whereas the film thickness of the third electrode layer 17*c* substantially decreases. Such steps of forming the first capacitance electrode 17 including the first electrode layer 17*a*, the second electrode layer 17*b*, and the third electrode layer 17*c* stacked one on another and of forming the capacitance insulation film 16*a* are the same as steps S1 to S6 in the method of forming the holding capacitor 16 in the first exemplary embodiment.

In the second exemplary embodiment, the second capacitance electrode 18 is formed into a single layer structure by using, for example, a single metal, an alloy, metal silicide, or polysilicide including at least one of high melting point metals such as Ti, Cr, Mo, Ta, and W, or non-crystalline silicon, polysilicon, or the like. Then, patterning and forming the second capacitance electrode 18 to include the opening portion 18*h* is a difference from the method of forming the holding capacitor 16 in the first exemplary embodiment. Note that in the case of forming the second capacitance electrode 18 by using amorphous silicon or polysilicon, phosphorus (P) or the like may be doped.

A method of forming the scanning line 3 in the second exemplary embodiment includes a step of forming the first wiring layer 3*e* containing tungsten silicide (WSix), a step of forming the second wiring layer 3*f* stacked on the first wiring layer 3*e* and containing a metal more stabilized through silicidation than tungsten (W), and a step of forming the third wiring layer 3*g* stacked on the second wiring layer 3*f* and containing tungsten silicide (WSix). Note that the metal incorporated in the second wiring layer 3*f* and more stabilized through silicidation than tungsten (W) is selected from titanium (Ti), hafnium (Hf) and zirconium (Zr).

The first wiring layer 3*e* and the second wiring layer 3*f* are patterned to include an opening portion as illustrated in FIG. 24, and in the step of forming the third wiring layer 3*g*, the opening portion is covered with a tungsten silicide film to prevent the second wiring layer 3*f* from being exposed in the opening portion, and the third wiring layer 3*g* is patterned to newly form the opening portion 3*h*. Such a method of forming the scanning line 3 is the same as steps S7 to S10 related to the formation of the second capacitance electrode 18 in the method of forming the holding capacitor 16 in the first exemplary embodiment.

Namely, the number of steps of forming the holding capacitor 216 and the scanning line 3 in the second exemplary embodiment is the same as the number of the steps of forming the scanning line 3 and the holding capacitor 16 in the first exemplary embodiment.

According to the liquid crystal device 200 as the electro-optical device of the second exemplary embodiment and the method of manufacturing the liquid crystal device 200, the following effects can be obtained in addition to the effects similar to effects (3), (4) and (6) of the first exemplary embodiment.

(7) The element substrate 210 of the liquid crystal device 200 is provided with the TFT 30 as a transistor for each pixel P and the holding capacitor 216 configured to hold a potential applied to the pixel electrode 15 coupled to the TFT 30. The holding capacitor 216 includes the first capacitance electrode 17 and the second capacitance electrode 18 disposed to face each other via the capacitance insulation film 16*a*. The first capacitance electrode 17 includes the first electrode layer 17*a* containing tungsten silicide (WSix), the second electrode layer 17*b* containing silicide of a metal (Ti) more stabilized through silicidation than tungsten (W), and the third electrode layer 17*c* containing silicon stacked one on another in this order. The second electrode layer 17*b* is formed by subjecting a metal (Ti) more stabilized through silicidation than tungsten (W) to a heat treatment at, for example, 600° C. or greater in an atmosphere containing an inert gas and thus, causing silicon liberated from the third electrode layer 17*c* mainly containing silicon to react with the metal (Ti) to form silicide (TiSix). Even when silicon is liberated owing to heat applied to the first electrode layer 17*a* containing tungsten silicide (WSix) to change film quality and reduce a light shielding property, the second electrode layer 17*b* is silicide thermally stabilized and thus, a reduction of the light shielding property of the first capacitance electrode 17 can be suppressed.

In addition, the scanning line 3 is provided between the holding capacitor 216 and the TFT 30 on the base substrate 10*s* of the element substrate 10. The scanning line 3 is disposed planarly corresponding to the intersection of the non-opening regions at which the TFT 30 is disposed. The scanning line 3 includes the first wiring layer 3*e* containing tungsten silicide (WSix), the second wiring layer 3*f* stacked and formed on the first wiring layer 3*e* and containing a metal (Ti) more stabilized through silicidation than tungsten (W), and the third wiring layer 3*g* stacked and formed on the second wiring layer 3*f* and containing tungsten silicide (WSix). Accordingly, since the scanning line 3 of the second exemplary embodiment is multilayered as compared to the scanning line 3 of the first exemplary embodiment, the scanning line 3 of the second exemplary embodiment has reduced resistance. In addition, the second wiring layer 3*f* interposed between the first wiring layer 3*e* and the third wiring layer 3*g* is subjected to a high temperature treatment at, for example, 600° C. or greater in forming the TFT 30 or the like, and silicon liberated owing to heat applied to the first wiring layer 3*e* or the third wiring layer 3*g* reacts with the metal (Ti) in the second wiring layer 3*f* to form silicide (TiSix). For this reason, even when film quality of the first wiring layer 3*e* or the third wiring layer 3*g* changes owing to the high temperature treatment described above to reduce a light shielding property, the second wiring layer 3*f* is silicidized and thus, a reduction of the light shielding property of the scanning line 3 can be suppressed. That is, light incident from the base substrate 10*s* side toward the TFT 30 can be blocked by the first capacitance electrode 17 of the holding capacitor 216 and also by the scanning line 3. Namely, as compared to the case of forming the holding capacitor 216 in an upper layer of the TFT 30 on the base substrate 10*s*, the liquid crystal device 200 as an electro-optical device capable of blocking incident light by the holding capacitor 216 and the scanning line 3 even when the light is incident from the base substrate 10*s* side toward the TFT 30, and including the holding capacitor 216 having desired electric capacitance can be provided.

(8) In the holding capacitor 216, the second capacitance electrode 18 disposed to face, via the capacitance insulation film 16*a*, the first capacitance electrode 17 independently formed for each pixel P is formed in a lattice pattern corresponding to the non-opening regions to function as the capacitance line 7 extending across the plurality of pixels P. Since the second capacitance electrode 18 is disposed on the side closer to the TFT 30 than the first capacitance electrode 17, light incident on the TFT 30 from the base substrate 10*s* side can be blocked effectively.

(9) The scanning line 3 is formed between the holding capacitor 216 and the TFT 30 on the base substrate 10*s* and thus, the depth of the gate contact 33' configured to couple the scanning line 3 and the gate electrode 30g decreases as compared to the case of forming the scanning line 3 between the base substrate 10s and the holding capacitor 16 as in the first exemplary embodiment. Thus, the gate contact 33' can be formed relatively easily and accurately. In addition, the gate contact 33' is provided in the groove formed in the second interlayer insulation film 11b along the channel region and the drain region of the semiconductor layer 30a. Accordingly, light incident on the channel region and the drain region of the semiconductor layer 30a in an oblique direction with respect to the thickness direction of the element substrate 210 can be blocked effectively by the gate contact 33'. Thus, occurrence of a light leakage current in the TFT 30 can be suppressed as compared to the wiring structure of the element substrate 10 of the first exemplary embodiment.

Figure 26:
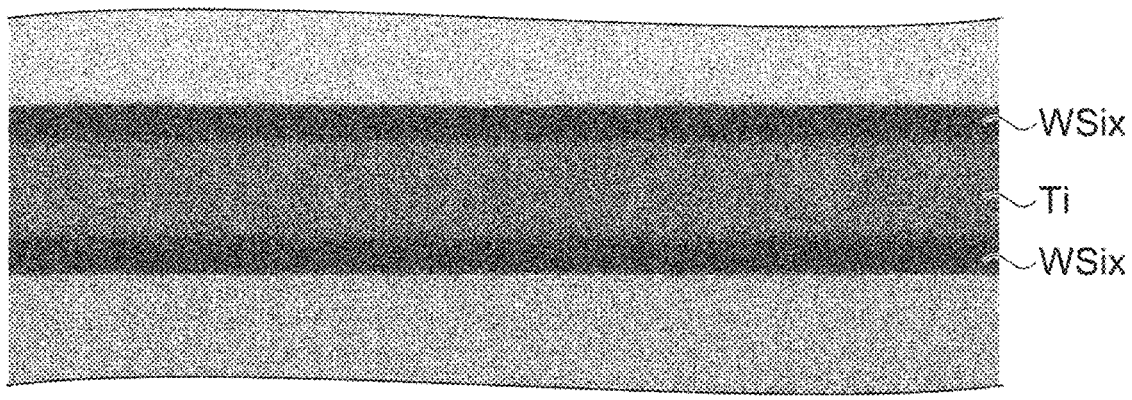
FIG. 26 is an electron micrograph illustrating a triple-layer structure of WSix/Ti/WSix.

Next, a specific state of silicidation of a metal more stabilized through silicidation than tungsten (W) will be described with reference to FIGS. 26 and 27. FIG. 26 is an electron micrograph illustrating a triple-layer structure of WSix/Ti/WSix, and FIG. 27 is an electron micrograph illustrating a triple-layer structure obtained after a heat treatment.

The second capacitance electrode 18 in the first exemplary embodiment and the scanning line 3 in the second exemplary embodiment are described to each include the triple-layer structure of tungsten silicide (WSix)/metal (Ti)/tungsten silicide (WSix) when each of the second capacitance electrode 18 and the scanning line 3 is formed, and to be subjected to a heat treatment at 600° C. or greater in an atmosphere containing an inert gas to change into a triple-layer structure of tungsten silicide (WSix)/metal silicide (TiSix)/tungsten silicide (WSix).

In the triple-layer structure illustrated in FIG. 26, a film thickness of a lower layer containing tungsten silicide (WSix) is 50 nm. A film thickness of an intermediate layer containing the metal (Ti) is 118 nm. A film thickness of an upper layer containing tungsten silicide (WSix) is 50 nm. A metal layer of such a triple-layer structure is formed on an NSG film stacked on a quartz substrate. On the other hand, a metal layer of the triple-layer structure illustrated in FIG. 27 includes an NSG film formed by performing a heat treatment at 680° C. in an atmosphere containing an inert gas ($N_2$) and a reaction gas (TEOS) to cover the metal layer illustrated in FIG. 26.

Figure 27:
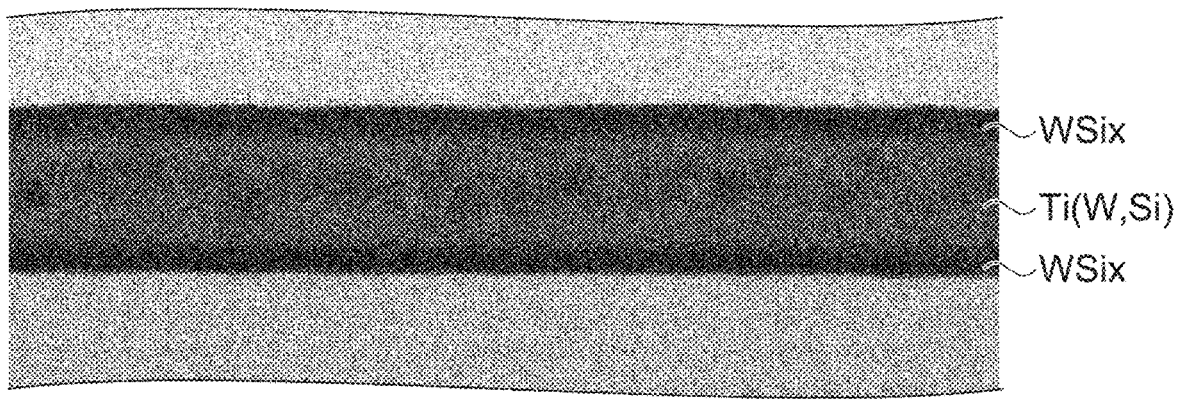
FIG. 27 is an electron micrograph illustrating a triple-layer structure obtained after a heat treatment.

As illustrated in FIG. 26, before the heat treatment, the intermediate layer including titanium (Ti) is in a uniform state without unevenness, but as illustrated in FIG. 27, after the heat treatment at 680° C. is performed, the state of the intermediate layer containing the metal (Ti) changes, and unevenness is observed. According to elemental analysis by Secondary Ion Mass Spectrometry (SIMS) of the triple-layer structure obtained after the heat treatment, tungsten (W) and silicon (Si) have been detected from the intermediate layer. That is, it is considered that tungsten (W) and silicon (Si) have been liberated by the heat treatment from the tungsten silicide (WSix) in the upper layer or in the lower layer and diffused into the intermediate layer including the metal (Ti). It has been found that since the metal (Ti) is more readily silicidized than tungsten (W), the intermediate layer including the metal (Ti) has changed into metal silicide (TiSix) after the heat treatment. An OD value indicating a light shielding property of the metal layer of the triple-layer structure obtained after the heat treatment has remained almost unchanged from an OD value of 5.15 obtained before the heat treatment.

Namely, as described in the above-described exemplary embodiments, the second electrode layer 17b constituting the first capacitance electrode 17 of the holding capacitor 16 (or the holding capacitor 216) is formed in advance with a metal more stabilized through silicidation than tungsten (W). Then, in a state where the second electrode layer 17b is in contact with the third electrode layer 17c containing silicon, a heat treatment at 600° C. or greater in an atmosphere containing an inert gas is performed to silicidize the second electrode layer 17b, and then the second electrode layer 17b becomes thermally stabilized. Thus, even when the holding capacitor 16 (or the holding capacitor 216) is formed, and subsequently a high temperature treatment at 600° C. or greater or at 1000° C. or greater is performed in the step of forming the interlayer insulation film or the TFT 30, or the like, a reduction of a light shielding property in the holding capacitor 16 (or the holding capacitor 216) can be suppressed.

In addition, it has been found that in a case where the first capacitance electrode 17 includes only an electrode layer containing tungsten silicide in the holding capacitor 16 (or the holding capacitor 216), when a high temperature treatment at 600° C. or greater or at 1000° C. or greater is performed, silicon is liberated from the electrode layer and thus, a surface of the electrode layer is roughened to cause irregularities on the surface. When the capacitance insulation film 16a as a thin film fails to be uniformly formed on such an electrode layer, the first capacitance electrode 17 and the second capacitance electrode 18 may be short-circuited. On the other hand, as described in each of the above-described embodiments, when the first capacitance electrode 17 includes a triple-layer structure of WSix/TiSix/Si, a surface of the first capacitance electrode 17 becomes relatively smooth and thus, the short circuit as described above becomes difficult to occur and the element substrate 10 (or the element substrate 210) can be formed with a high yield.

Third Exemplary Embodiment

Electronic Apparatus

Figure 28:
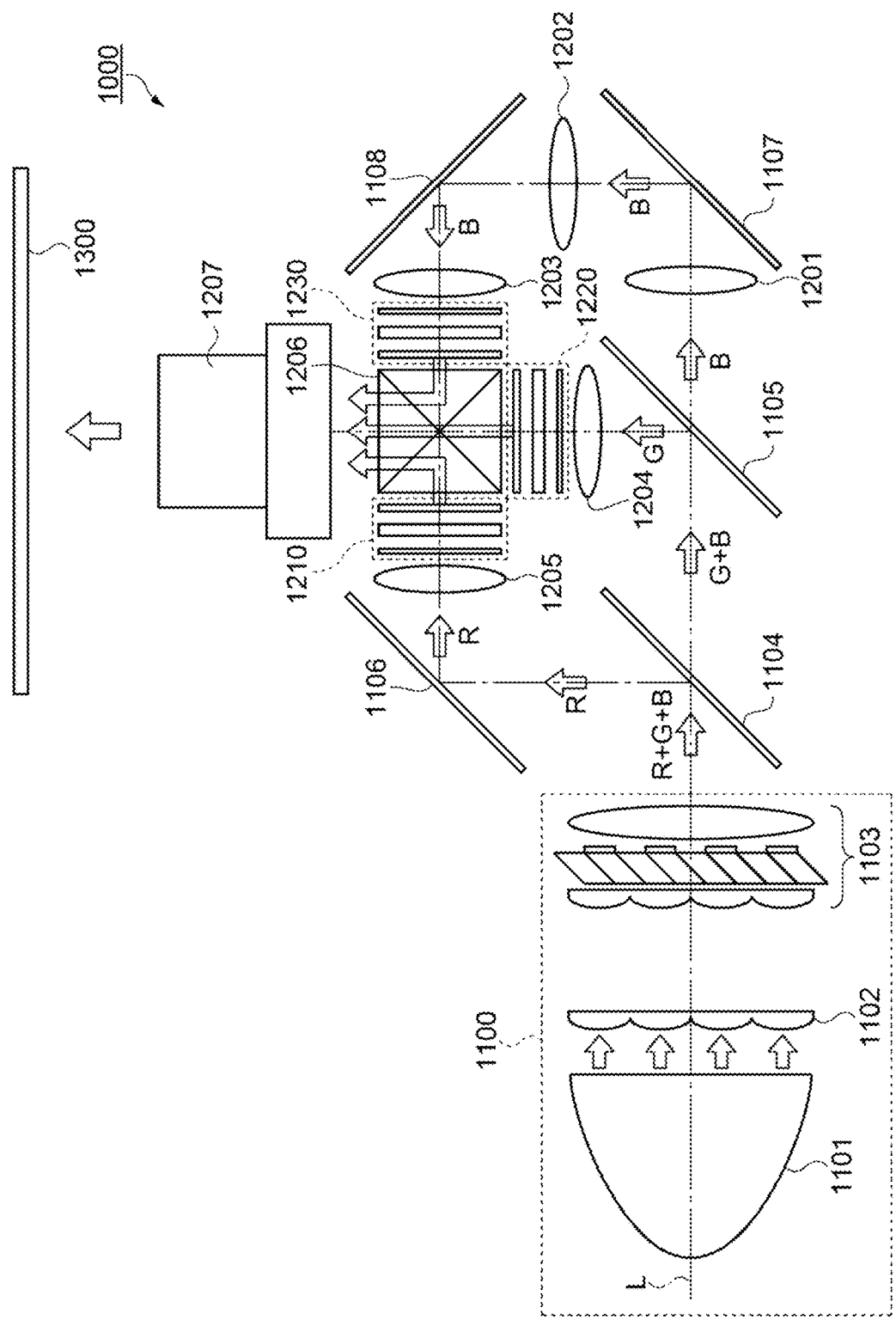
FIG. 28 is a schematic view illustrating a configuration of a projection-type display apparatus as an electronic apparatus according to a third exemplary embodiment.

Next, a projection-type display apparatus will be described with reference to FIG. 28 as an example of an electronic apparatus to which the liquid crystal device according to each of the above-described embodiments is applied. FIG. 28 is a schematic view illustrating a configuration of the projection-type display apparatus as the electronic apparatus.

As illustrated in FIG. 28, a projection-type display apparatus 1000 as an electronic apparatus according to a third exemplary embodiment includes a polarized light illumination apparatus 1100 disposed along a system optical axis L, and two dichroic mirrors 1104 and 1105 as light separation elements. In addition, the projection-type display apparatus 1000 includes three reflection mirrors 1106, 1107 and 1108 and five relay lenses 1201, 1202, 1203, 1204, and 1205. Further, the projection-type display apparatus 1000 includes liquid crystal light bulbs 1210, 1220, and 1230 of a transmissive type as three light modulation means, a cross dichroic prism 1206 as a photosynthetic element, and a projection lens 1207.

The polarized light illumination apparatus 1100 is generally includes a lamp unit 1101 as a light source including a white light source such as an extra-high pressure mercury lamp or a halogen lamp, an integrator lens 1102, and a polarization conversion element 1103.

The dichroic mirror 1104 reflects red light (R) of a polarized light flux emitted from the polarized light illumination apparatus 1100 and transmits green light (G) and blue light (B). The other dichroic mirror 1105 reflects the green light (G) transmitted by the dichroic mirror 1104 and transmits the blue light (B).

The red light (R) reflected by the dichroic mirror 1104 is reflected by the reflection mirror 1106 and subsequently is incident on the liquid crystal light bulb 1210 via the relay lens 1205.

The green light (G) reflected by the dichroic mirror 1105 is incident on the liquid crystal light bulb 1220 via the relay lens 1204.

The blue light (B) transmitted by the dichroic mirror 1105 is incident on the liquid crystal light bulb 1230 via a light guide system including three relay lenses 1201, 1202, and 1203 and two reflection mirrors 1107 and 1108.

The liquid crystal light bulbs 1210, 1220, and 1230 are each disposed to face an incident surface of each type of color light of the cross dichroic prism 1206. The color light incident on the liquid crystal light bulbs 1210, 1220, and 1230 is modulated based on video information (video signal) and is emitted toward the cross dichroic prism 1206. In this prism, four rectangular prisms are bonded together, and on inner surfaces of the prisms, a dielectric multilayer film configured to reflect red light and a dielectric multilayer film configured to reflect blue light are formed in a cross shape. Three types of color light are synthesized by these dielectric multilayer films, and light representing a color image is synthesized. The synthesized light is projected onto a screen 1300 by the projection lens 1207 as a projection optical system, and an image is enlarged and displayed.

The liquid crystal light bulb 1210 is a bulb to which the liquid crystal device 100 (see FIG. 1) of the first exemplary embodiment is applied. A pair of light-polarizing elements disposed in a crossed-Nicols state on the incident side and the emission side of the color light of the liquid crystal device 100 are disposed with a gap interposed between the pair of light-polarizing elements. In addition, the light-polarizing elements are disposed to cause the color light to be incident from the element substrate 10 side of the liquid crystal device 100. The same applies to the other liquid crystal light bulbs 1220 and 1230. Note that the liquid crystal device 200 of the second exemplary embodiment may be applied to the liquid crystal light bulbs 1210, 1220, and 1230.

According to such a projection-type display apparatus 1000, since the liquid crystal device 100 of the first exemplary embodiment is used as the liquid crystal light bulbs 1210, 1220, and 1230, bright display can be obtained by projection, and light incident on the TFT 30 from the base substrate 10*s* side can be blocked reliably. Thus, the projection-type display apparatus 1000 capable of suppressing occurrence of a light leakage current in the TFT 30 and achieving a stabilized driving state can be provided.

Note that the third exemplary embodiment includes the configuration in which the white light (polarized light flux) emitted from the polarized light illumination apparatus 1100 is dispersed into the respective types of color light by the dichroic mirrors and then is incident on the liquid crystal light bulbs 1210, 1220, and 1230, but the third exemplary embodiment is not limited to this configuration. For example, a solid-state light source such as a laser light source and an LED capable of emitting light of each color may be used.

The disclosure is not limited to the exemplary embodiments described above, and various modifications and improvements may be added to the exemplary embodiments described above. Modifications are described below.

Modification 1

In each of the exemplary embodiments described above, the step of performing a heat treatment at 600° C. or greater in an atmosphere containing an inert gas (step S5) to silicidize the second electrode layer 17*b* containing a metal more stabilized through silicidation than tungsten (W) may not necessarily be performed. At the step of forming the capacitance insulation film 16*a* (step 6), a reaction gas is subjected to a heat treatment at 600° C. or greater by a low-pressure CVD method to form the capacitance insulation film 16*a*, and then the second electrode layer 17*b* can be silicidized by the heat treatment at step 6.

Modification 2

The electro-optical device to which the element substrate according to each of the exemplary embodiments described above is applicable is not limited to a liquid crystal device. For example, the electro-optical device is also applicable to an organic EL apparatus including for each pixel an organic EL element including a light-emitting functional layer between a pixel electrode and a counter electrode.

Modification 3

The electronic apparatus to which the liquid crystal device as the electro-optical device according to each of the exemplary embodiments described above is applicable is not limited to the projection-type display apparatus 1000 described in the third exemplary embodiment. For example, the counter substrate 20 of the liquid crystal device may include color filters corresponding to at least red (R), green (G), and blue (B), and the liquid crystal light bulb may include a single plate configuration. In addition, the liquid crystal device of each of the exemplary embodiments described above can be used suitably as, for example, a display unit of a projection-type head-up display (HUD), a head-mounted display (HMD), an electronic book, a personal computer, a digital still camera, a liquid crystal television, a view finder-type or monitor direct view-type video recorder, a car navigation system, an electronic diary, an information terminal device such as POS, or the like.

The entire disclosure of Japanese Patent Application No. 2017-248834, filed Dec. 26, 2017 is expressly incorporated by reference herein.

What is claimed is:

1. An electro-optical device comprising:
a substrate,
a transistor, and
a holding capacitor, wherein
the holding capacitor is provided between the substrate and the transistor, and includes a first capacitance electrode disposed on the substrate side, and a second capacitance electrode disposed on the first capacitance electrode via a capacitance insulation film, and
the first capacitance electrode includes a first electrode layer containing tungsten silicide, a second electrode layer containing silicide of a metal more stabilized through silicidation than tungsten, and a third electrode layer containing silicon stacked one on another.

2. The electro-optical device according to claim 1, wherein the second capacitance electrode includes a fourth electrode layer containing tungsten silicide, a fifth electrode layer containing silicide of a metal more stabilized through silicidation than tungsten, and a sixth electrode layer containing tungsten silicide stacked one on another.

3. The electro-optical device according to claim 1, wherein the third electrode layer covers surfaces of the first electrode layer and the second electrode layer stacked one on another.

4. The electro-optical device according to claim 1, including a scanning line provided between the substrate and the holding capacitor and electrically coupled to the transistor.

5. The electro-optical device according to claim 1, comprising:
- a scanning line provided between the holding capacitor and the transistor and electrically coupled to the transistor, wherein
- the scanning line includes a first wiring layer containing tungsten silicide, a second wiring layer containing silicide of a metal more stabilized through silicidation than tungsten, and a third wiring layer containing tungsten silicide stacked one on another.

6. The electro-optical device according to claim 1, wherein the metal is selected from titanium, hafnium, and zirconium.

7. An electronic apparatus comprising the electro-optical device according to claim 1.

* * * * *